US010460913B2

(12) United States Patent
Tamari et al.

(10) Patent No.: US 10,460,913 B2
(45) Date of Patent: Oct. 29, 2019

(54) PLASMA PROCESSING APPARATUS AND PLASMA PROCESSING METHOD

(71) Applicant: HITACHI HIGH-TECHNOLOGIES CORPORATION, Minato-ku, Tokyo (JP)

(72) Inventors: Nanako Tamari, Tokyo (JP); Hitoshi Tamura, Tokyo (JP); Naoki Yasui, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 9 days.

(21) Appl. No.: 15/562,353

(22) PCT Filed: Jan. 30, 2017

(86) PCT No.: PCT/JP2017/003087
§ 371 (c)(1),
(2) Date: Sep. 27, 2017

(87) PCT Pub. No.: WO2018/061235
PCT Pub. Date: Apr. 5, 2018

(65) Prior Publication Data
US 2019/0006153 A1 Jan. 3, 2019

(30) Foreign Application Priority Data
Sep. 28, 2016 (JP) ................................. 2016-188985

(51) Int. Cl.
H01J 37/32 (2006.01)
H01L 21/3065 (2006.01)
H01L 21/67 (2006.01)

(52) U.S. Cl.
CPC ..... H01J 37/32311 (2013.01); H01J 37/3222 (2013.01); H01J 37/32229 (2013.01);
(Continued)

(58) Field of Classification Search
CPC ............ H01J 37/32311; H01J 37/3222; H01J 37/32229; H01J 37/3065;
(Continued)

(56) References Cited

U.S. PATENT DOCUMENTS 6,829,056 B1 * 12/2004 Barnes .............. H01J 37/32935
118/708
2002/0004309 A1 * 1/2002 Collins ................. C23C 16/507
438/719
2015/0072534 A1 * 3/2015 Himori ............ H01L 21/31116
438/725

FOREIGN PATENT DOCUMENTS

JP   02-174229 A   7/1990
JP   02-312227 A   12/1990
(Continued)

Primary Examiner — Lan Vinh
(74) Attorney, Agent, or Firm — Miles & Stockbridge, P.C.

(57) ABSTRACT

In order to provide a plasma processing apparatus or method with improved processing uniformity, a plasma processing apparatus includes: a processing chamber which is disposed inside a vacuum container; a sample stage which is disposed inside the processing chamber and has a top surface for placing a wafer corresponding to a processing target thereon; an electric field forming part which forms an electric field supplied into the processing chamber; a coil which forms a magnetic field for forming plasma inside the processing chamber by an interaction with the electric field; and a controller which increases or decreases intensity of the plasma inside the processing chamber by repeatedly increasing or decreasing intensity of the magnetic field formed by the coil at a predetermined interval, wherein the wafer is processed while the plasma is repeatedly formed and diffused.

12 Claims, 10 Drawing Sheets

(52) U.S. Cl.
CPC .... *H01L 21/3065* (2013.01); *H01L 21/67069* (2013.01); *H01J 2237/24507* (2013.01); *H01J 2237/24564* (2013.01); *H01J 2237/327* (2013.01); *H01J 2237/3344* (2013.01)

(58) Field of Classification Search
CPC ... H01J 2237/24507; H01J 2237/24564; H01J 2237/327; H01J 2237/3344; H01L 21/3065; H01L 21/67069
USPC ........ 438/710.712, 714, 715, 723, 706, 709, 438/710; 156/345.35, 345.36, 345.39, 156/345.41, 345.42, 345.46
See application file for complete search history.

(56) References Cited

FOREIGN PATENT DOCUMENTS

| | | |
|---|---|---|
| JP | 06-005385 A | 1/1994 |
| JP | 08-288259 A | 1/1996 |

\* cited by examiner

R [mm]

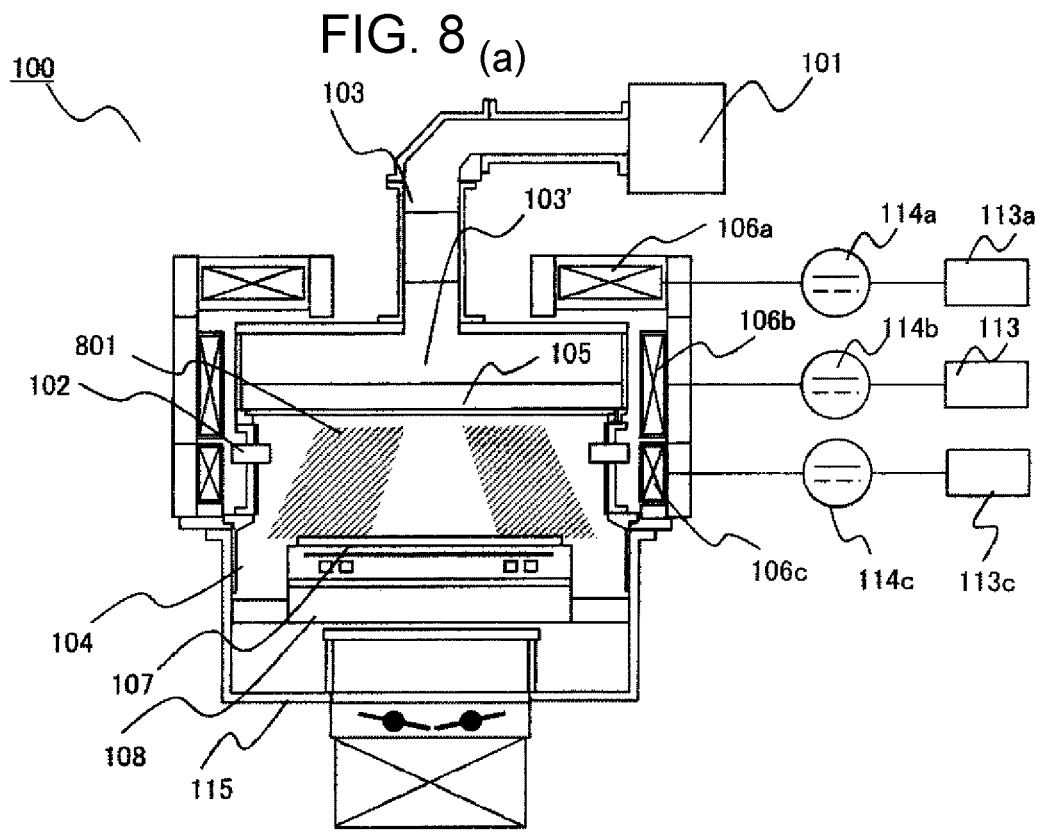
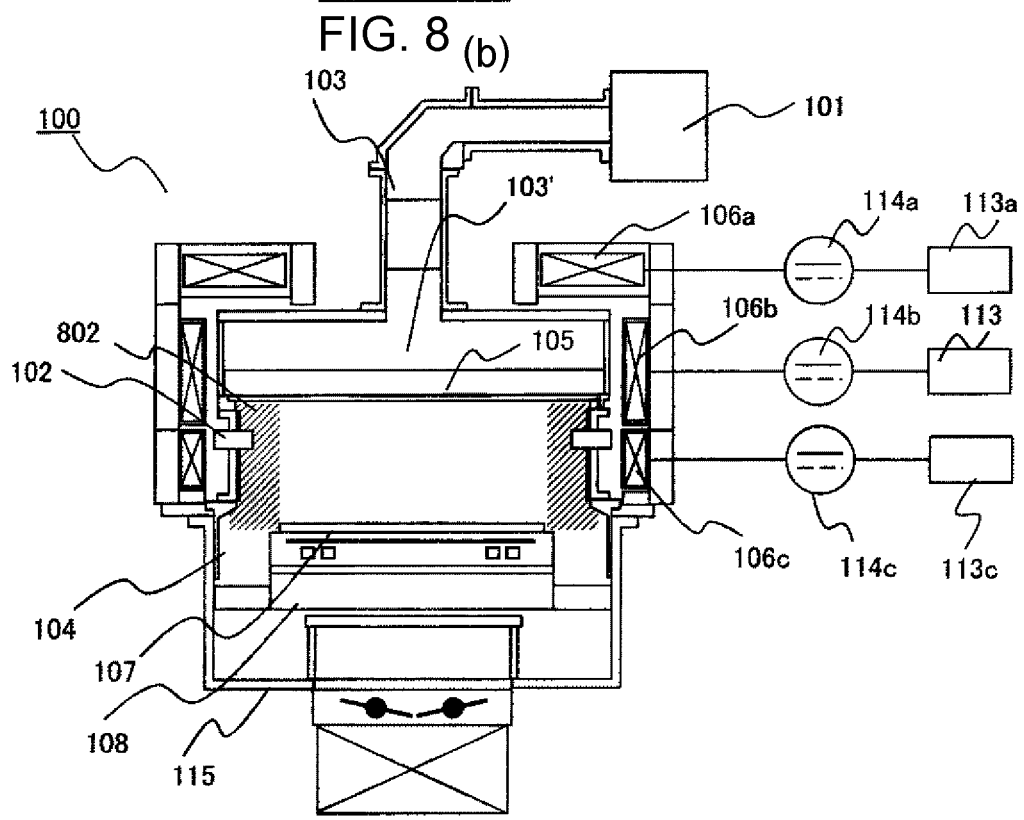
FIG. 8 (a)
FIG. 8 (b)

PLASMA PROCESSING APPARATUS AND PLASMA PROCESSING METHOD

TECHNICAL FIELD

The present invention relates to a plasma processing apparatus and a plasma processing method which process a sample such as a semiconductor wafer by using plasma formed inside a processing chamber and particularly to a plasma processing apparatus and a plasma processing method which supply a magnetic field into a processing chamber and process a sample by causing an action with plasma.

BACKGROUND ART

Regarding a semiconductor manufacturing process in recent years, processes such as multiple exposure and spacer patterning are mainly performed due to the limit of miniaturization by optical lithography. In such a spacer patterning process represented by multiple exposure or SADP (Self Aligned Double Patterning), the number of etching steps increases.

A slight degradation in uniformity of etching performance within a surface of a sample such as a semiconductor wafer to be processed in accordance with each etching step is accumulated due to an increase in the number of etching steps and hence slight degradation of in-plane uniformity is not also easily allowed as the number of steps increases.

Therefore, in the semiconductor manufacturing process represented as the newest logic, particularly, a FEOL (Front End of Line) process, there has been a demand for apparatus performance capable of etching a surface of a substrate to be processed with high uniformity.

In a microwave plasma etching apparatus, a reactor, an evacuation structure, a plasma axial symmetry technology, a wafer placement electrode temperature control technology, and the like are used as a method of realizing the above-described uniformity.

As a related art for obtaining a uniform process distribution inside a substrate, a method of obtaining a uniform plasma density distribution by a high-frequency electric field distribution control disclosed in Japanese Patent Application Laid-Open No. 2-312227 (PTL 1) and Japanese Patent Application Laid-Open No. 8-288259 (PTL 2) is known.

PTL 1 discloses a technology of improving a sample etching speed by increasing an electron temperature of plasma inside a processing chamber in such a manner that a value of a current supplied to a coil forming a magnetic field is periodically increased or decreased in synchronization with a periodical increase or decrease in intensity of a microwave generated by a magnetron in order to realize a pulse discharge forming plasma inside the processing chamber.

Further, PTL 2 discloses a technology provided with a high-frequency antenna wound on the outside of a chamber and a solenoid coil connected to a DC power supply via a switch. Specifically, the technology alternatively forms helicon plasma and inductively coupled plasma by periodically allowing or prohibiting the supply of a DC current to the solenoid coil by the switch while supplying an electric field from the high-frequency antenna into the chamber and freely changes the density of the plasma by controlling a transportation of the plasma toward a substrate disposed below the chamber or an ion/radical generation ratio in the plasma in a desired way.

CITATION LIST

Patent Literature

PTL 1: Japanese Patent Application Laid-Open No. 2-312227
PTL 2: Japanese Patent Application Laid-Open No. 8-288259

SUMMARY OF INVENTION

Technical Problem

Since the above-described related art did not sufficiently consider the following points, a problem arises as below.

That is, in the plasma processing apparatus according to the above-described related art, there is a case in which a distribution of the density of the plasma becomes non-uniform remarkably in a space inside a vacuum container generating plasma under a specific condition. In the above-described related art, since non-uniformity of a distribution on a processing target substrate corresponding to a substrate-shaped sample such as a semiconductor wafer is suppressed even in such a case, it is possible to reduce non-uniformity of processing of a surface of the sample to a certain extent.

However, in the technologies disclosed in PTLS 1 and 2, the magnetic field formed in the processing chamber is intermittently formed by the coil and the distribution of the density of the plasma above the top surface of the substrate is adjusted to improve the uniformity of the processing. However, in the related arts, a timing or period for changing the intensity of the magnetic field formed by the coil is not mentioned and any appropriate reference for obtaining the uniformity of the processing of the sample corresponding to the processing target in the radial direction is not considered.

The invention solves the above-described problems and an object of the invention is to provide a plasma processing apparatus capable of improving uniformity.

Solution to Problem

The above-described object is achieved by a plasma processing apparatus including: a processing chamber which is disposed inside a vacuum container; a sample stage which is disposed inside the processing chamber and has a top surface for placing a wafer to be processed thereon; an electric field generating part which generates an electric field supplied into the processing chamber; a coil which generates a magnetic field for generating plasma inside the processing chamber by an interaction with the electric field; and a controller which increases or decreases an intensity of the plasma inside the processing chamber by repeatedly causing the intensity of the magnetic field generated by the coil to be at a first value and a second value lower than the first value in respective predetermined intervals, wherein the wafer is processed while the plasma is repeatedly generated and diffused.

Advantageous Effects of Invention

According to the invention, it is possible to improve uniformity of processing of a processing target substrate by autonomously and uniformly distributing a density of plasma inside a processing chamber without remarkably changing a conventional apparatus configuration.

BRIEF DESCRIPTION OF DRAWINGS

FIGS. 8(a) and 8(b) are a longitudinal sectional view schematically illustrating the plasma area formed inside the processing chamber at the specific time in which the DC power is supplied from the coil power supply unit to the solenoid coil in the plasma processing apparatus according to the modified example of the embodiment illustrated in FIG. 1.

DESCRIPTION OF EMBODIMENTS

Embodiments of the invention will be described with reference to the drawings below.

First Embodiment

Figure 1:
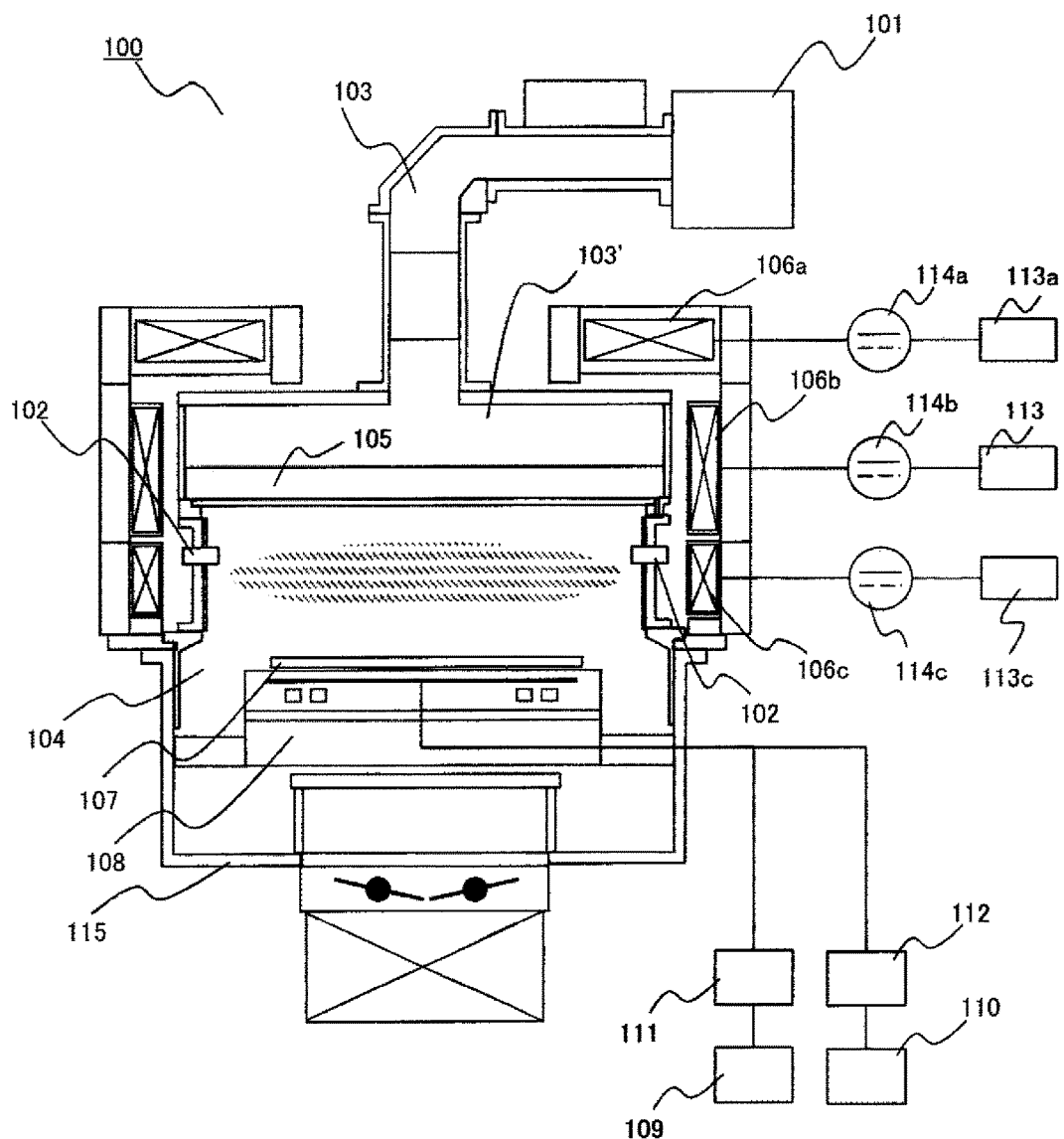
FIG. 1 is a longitudinal sectional view schematically illustrating a configuration of a plasma processing apparatus according to an embodiment of the invention.

An embodiment of the invention will be described with reference to FIGS. 1 to 11. FIG. 1 is a longitudinal sectional view schematically illustrating a configuration of a plasma processing apparatus according to the embodiment of the invention.

In this embodiment, a plasma processing apparatus which processes a substrate-shaped sample such as a semiconductor wafer (hereinafter, referred to as a wafer) placed on a top surface of a sample stage disposed inside a processing chamber which is disposed inside a vacuum container and is depressurized by plasma formed inside the processing chamber will be described. Particularly, in this embodiment, an ECR plasma etching apparatus which supplies an electric field of a microwave propagated through a waveguide and a magnetic field formed by a solenoid coil into a processing chamber and etches a sample by using plasma formed by excitation of atoms or molecules of a processing gas supplied into the processing chamber by an electron microtron resonance (ECR) generated by the interaction thereof will be described.

A plasma processing apparatus 100 of this embodiment mainly includes a vacuum container part in which a processing chamber is disposed, an electromagnetic field forming part which is disposed above and around the vacuum container part, and an exhaust device part which is disposed below the vacuum container part. The electromagnetic field forming part is a part which generates an electric field and a magnetic field supplied into the processing chamber.

Further, the exhaust device part includes a vacuum pump such as a turbo molecular pump and a rotary pump disposed to be connected to a bottom surface at a lower portion of the vacuum container and discharging air inside the vacuum container to decrease a pressure therein and a flow rate adjustment valve increasing and decreasing a passageway cross-sectional area of an exhaust path between a vacuum pump inlet and an exhaust port extending from the inside of the vacuum container to adjust a flow rate or a speed of an exhaust gas. FIG. 1 is a diagram schematically illustrating a configuration of a main part of the plasma processing apparatus 100.

A vacuum container 115 of the plasma processing apparatus 100 of this embodiment is a metallic container of which a part of a side wall forming at least an upper portion has a cylindrical shape. A processing chamber 104 which is a space having an outer periphery surrounded by at least apart of an inner wall of the side wall to have a cylindrical shape is disposed inside the cylindrical side wall.

A processing gas is supplied into an upper space of the processing chamber 104 of the vacuum container 115. The supplied gas is excited by the electric field or the magnetic field formed by the electromagnetic field forming part and supplied to the upper portion of the processing chamber 104.

Atoms or molecules of the excited processing gas form a discharge to generate plasma including charged particles such as ions and activated radicals for the processing chamber. The upper space of the processing chamber 104 is formed as a discharging space forming the plasma.

A window member 105 which forms an upper portion of the vacuum container 115 is disposed above the discharging space. The window member 105 of this embodiment is a disc-shaped member that is formed of a dielectric material such as quartz and covers the cylindrical discharge chamber of the processing chamber 104. The window member 105 is loaded on an upper end of the side wall of the vacuum container 115 with a seal member such as an O-ring interposed between an outer peripheral edge of a lower surface thereof and the upper end of the side wall of the vacuum container 115.

With this configuration, when the O-ring is pressed vertically to be deformed, a gap between the inside of the processing chamber 104 and the outside of the vacuum container 115 is air-tightly sealed. Further, a shower plate is disposed below a lower surface of the window member 105.

The shower plate is a disc-shaped member that forms a ceiling surface of the processing chamber 104. A plurality of introduction holes through which the processing gas passes and which allows the processing gas to be introduced into the processing chamber 104 from above are disposed at the center portion of the shower plate.

Further, the shower plate is disposed below the window member 105 with a gap communicating with the gas introduction holes and diffusing the processing gas supplied thereinto between the lower surface of the window member 105 and the shower plate. This gap is connected to a pipe which is a gas supply path for a processing gas connected to the vacuum container 115 so that the gap communicates with the pipe.

A cylindrical sample stage 108 having a wafer 107 placed on a top surface thereof is disposed inside the processing chamber 104 at the lower portion of the discharging space. The lower space of the processing chamber 104 at the lower portion of the sample stage 108 faces the processing chamber 104 and communicates with the inlet of the vacuum pump through a circular exhaust port.

In the processing chamber 104, an outer periphery of a side wall of the cylindrical sample stage 108 is disposed so that a space between the side wall and an inner wall of the cylindrical processing chamber 104 surrounds the sample stage 108. Further, a plurality of beam-shaped support members are disposed between the vacuum container 115 and the side wall of the sample stage 108 to connect them to each other while forming an equivalent angle or a substantially equivalent angle around the vertical center axis of the sample stage 108.

In this embodiment, a gas supplied to the discharging space above the sample stage 108 inside the processing chamber 104 through the gas introduction holes at the center portion of the shower plate, particles of plasma formed in the discharging space, or fine particles generated by the processing of the wafer 107 pass through a space formed between the side walls of the sample stage 108 and the processing chamber 104 and corresponding to a passageway and flow into the lower space of the processing chamber 104 below the sample stage 108. Fine particles flowing into the lower space flow from the exhaust port into the vacuum pump and are discharged to the outside of the processing chamber 104.

In this embodiment, a flow of the particles inside the processing chamber 104 is formed to be symmetric with respect to the vertical axis of the sample stage 108. Accordingly, the non-uniform distribution of the characteristic of the processing around the center axis of the wafer 107 placed and held on the top surface of the sample stage 108 so as to be aligned to the central axis and the result thereof is reduced in the circumferential direction.

As described above, the electromagnetic field forming part is disposed at the outer peripheral position of the cylindrical side wall of the upper portion of the vacuum container 115 surrounding the discharging space of the processing chamber 104 and the upper side of the window member 105. A waveguide 103 which is a transfer path for the electric field of the microwave supplied into the processing chamber 104 corresponding to a part forming the electromagnetic field forming part is disposed above the window member 105.

Further, a cylindrical cavity 103' which is connected to the lower end of the waveguide 103 and has a diameter equal or substantially equal to that of the discharging space of the processing chamber 104 or the window member 105 is disposed above the window member 105 and forms the electromagnetic field forming part.

The waveguide 103 of the embodiment includes a cylindrical portion which is connected to an upper end of the cavity 103' and has a circular cross-section. Further, a waveguide portion having a square cross-section and a center axis aligned to the horizontal direction while one end thereof is connected to the upper end of the cylindrical waveguide portion is provided.

Further, a microwave generation power supply unit 101 which is a magnetron receiving power and forming an electric field of a microwave by an oscillation is disposed to be connected to the other end of the square portion of the waveguide 103 and forms the electromagnetic field forming part.

The electric field of the microwave formed at the other end of the square portion of the waveguide 103 by the microwave generation power supply unit 101 is horizontally transferred along the axis of the square portion. Next, the electric field is transferred downward along the axis of the cylindrical portion and is introduced into the cavity 103'.

Regarding the electric field of the microwave introduced to the cavity 103', a specific mode of the electric field is formed or enhanced. The electric field which is formed or enhanced as a specific mode passes through the window member 105 and is transferred to the discharging space of the processing chamber 104. For this reason, it can be understood that the processing chamber 104 forms a part of the waveguide 103.

Further, a plurality of solenoid coils 106a, 106b, and 106c are disposed at the outer peripheral positions of the vacuum container 115. Particularly, the plurality of solenoid coils 106a, 106b, and 106c are respectively disposed at the outer periphery of the side wall surrounding the discharging space of the vacuum container 115 and the outer periphery of the cylindrical portion of the waveguide 103 corresponding to the upper side of the cavity 103' to surround the outer peripheries.

The solenoid coils 106a to 106c are disposed in an annular shape to surround the side walls of the waveguide 103, the cavity 103', and the processing chamber 104. In this embodiment, each of the solenoid coils 106a to 106c has a rectangular cross-sectional shape in the drawings.

Further, the solenoid coils 106a to 106c form a three-stage structure in which three height positions at the centers of the coils are different from one another.

Coil power supply units 114a, 114b, and 114c which respectively supply DC power to the solenoid coils 106a to 106c are electrically connected thereto. Further, controllers 113a, 113b, and 113c are respectively connected to the coil power supply units 114a to 114c so as to communicate therewith.

The controllers 113a, 113b, and 113c respectively transmit instructions in which the coil power supply units 114a, 114b, and 114c connected thereto change an absolute value of the DC current supplied therefrom with time to the coil power supply units 114a, 114b, and 114c.

Further, in this embodiment, a plasma monitor 102 which detects the intensity or density of the plasma formed inside the processing chamber 104 or the distribution thereof is disposed at a plurality of positions of the upper side wall surrounding the discharging space of the processing chamber 104. The plasma monitor 102 includes a window which is formed as a member having translucency and plasma resistance such as quartz and is disposed on the side wall of the vacuum container 115 and a light receiver which receives light emitted from the plasma and is able to receive its intensity.

Further, the plasma monitor 102 is not limited to such an optical detector. For example, the plasma monitor may electrically detect a state such as plasma intensity by detecting a voltage of high frequency power or DC power supplied to the sample stage 108.

Further, in this embodiment, a position in which the plasma monitor 102 for optically detecting the plasma state is appropriately selected in response to the detected configuration. For example, the plasma monitor may be disposed at the inside or the top surface of the sample stage 108 and may be disposed at the outside of the processing chamber 104 like the upper side of the window member 105.

The exhaust device part is provided below the lower surface of the vacuum container 115. The exhaust device part includes a turbo molecular pump which forms a part of the vacuum pump and a flow rate adjustment valve which is disposed between the inlet of the turbo molecular pump and the exhaust port of the processing chamber 104.

The flow rate adjustment valve includes a plurality of plate-shaped flaps which are disposed at the inside of a passageway of a duct pipe corresponding to an exhaust path between the turbo molecular pump and the exhaust port to rotate about an axis extending in a direction crossing the center axis of the passageway and which increase or decrease the passageway cross-sectional area to adjust a flow rate or a speed. Further, in this embodiment, a circular valve is provided inside the processing chamber 104 between the circular exhaust port and the sample stage 108 disposed thereabove while the axes are aligned.

The circular valve moves in the vertical direction inside the processing chamber 104 below the sample stage 108 by a driving device (not illustrated) such as a stepping motor disposed below the bottom surface of the vacuum container 115 or an actuator driven by a fluid to be connected to or separated from the inner wall surface of the vacuum container 115 forming the outer peripheral edge of the circular exhaust port. With such a configuration, the circular valve is used to open or air-tightly close the exhaust port or to increase or decrease the opening area of the exhaust path by increasing or decreasing a distance with respect to the exhaust port.

Further, in this embodiment, the vertical center axes of the window member 105, the shower plate, the processing chamber 104, particularly the discharging space above the sample stage 108, the sample stage 108, and the exhaust port are arranged to match or substantially match one another in the vertical direction.

The sample stage 108 has a top surface for placing the wafer 107 thereon. This surface is covered with a dielectric film which is formed of ceramics such as yttria or alumina and which covers the upper portion of the sample stage 108.

A plurality of film-shaped electrodes formed of metal such as tungsten and electrostatically attracting the wafer 107 are arranged inside the film. These electrodes are arranged to correspond to a plurality of areas in the radial direction of the wafer 107.

Further, in this embodiment, these electrodes are electrically connected to the DC power supply unit 109 that supplies DC power for forming static electricity forming an electrostatic attraction force on the dielectric film. These electrodes are electrically connected to the high-frequency power supply unit 110 that supplies high-frequency power with a predetermined frequency.

The high-frequency power supply unit 110 supplies high-frequency power, which forms a bias potential deriving charged particles such as ions in the plasma during the processing of the wafer 107 to the top surface of the wafer 107 in response to a potential difference with the plasma, to the electrode. The high-frequency power supply unit 110 is electrically connected to a plurality of electrodes via a high-frequency filter circuit 111 and a matching circuit 112.

A vacuum transportation container which is another vacuum container (not illustrated) is directly connected to the side wall of the vacuum container 115 of the plasma processing apparatus 100 or is connected thereto through another member. The vacuum transportation container includes a transportation chamber which decreases in pressures and transports the wafer 107 corresponding to the processing target.

A pressure of the depressurized transportation chamber is kept at a pressure which is equal to or slightly higher than that of the processing chamber 104. In this state, the wafer 107 is transported by a robot arm disposed inside the transportation chamber within the vacuum transportation container.

The wafer 107 is placed on a hand of the robot arm and is transported from the inside of the depressurized transportation chamber into the processing chamber 104. At this time, the wafer 107 is disposed to penetrate a side wall of the vacuum container 115 and a side wall of the vacuum transportation container connected thereto and is transported through a gate which is a path (not illustrated) for the wafer 107 communicating with a gap between the transportation chamber and the processing chamber 104.

The wafer 107 which is transported into the processing chamber 107 while being placed on the hand is transferred onto the sample stage 108. Next, the robot arm moves back from the processing chamber 104.

Next, the wafer 107 is placed on a placement surface formed by the dielectric film of the sample stage 108. When the wafer 108 is placed on the dielectric film, DC power is supplied from the DC power supply unit 109 to the plurality of electrodes arranged inside the dielectric film.

A static charge is formed and accumulated inside the film including a dielectric material such as ceramics by the supplied DC power. Charges are polarized inside the wafer 107 by the static charge and an electrostatic force is formed between the charges of the dielectric film and the wafer 107 and is absorbed and held on the wafer 107.

In this state, the inside of the processing chamber 104 is sealed. In a state where the inside of the processing chamber 104 is sealed, a processing gas is introduced from a gas source (not illustrated) into the processing chamber 104 from above through a plurality of gas introduction holes arranged at the center portion of the shower plate.

Further, the exhaust device part is driven in response to an instruction from a control device (not illustrated) and a pressure inside the processing chamber 104 is adjusted to a value within a desired range suitable for the processing of the wafer 107 in consideration of a balance of a flow rate or a speed of a gas introduced from a gas introduction port and an exhaust gas discharged from an exhaust port.

In this state, the electric field of the microwave generated by the power of the microwave power supply unit 101 is transferred through a waveguide path inside the waveguide 103. The transferred microwave is introduced into the cavity 103' through a circular cross-sectional portion of the waveguide 103. Further, the microwave passes through the window member 105 forming the bottom surface of the cavity 103' and is introduced into the processing chamber 104.

Furthermore, in this embodiment, a DC current is supplied from the coil power supply units 114a to 114c to the solenoid coils 106a to 106c around the processing chamber 104 along with the supply of the microwave. The magnetic field formed by the solenoid coils 106a to 106c is supplied into the processing chamber 104.

Further, in this embodiment, circularly polarized waves are formed in the cylindrical portion of the microwave electric field. The formed circularly polarized waves are supplied from the lower end of the cylindrical portion of the waveguide 103 to the processing chamber 104 through the cavity 103'.

In this embodiment, the DC current supplied from the coil power supply units 114a to 114c to the solenoid coils 106a to 106c is adjusted so that the absolute values become a plurality of values every predetermined period with time by instruction signals from the controllers 113a to 113c. That is, in this embodiment, a plurality of large and small DC current values are repeatedly and respectively supplied to the solenoid coils 106a to 106c during a period in which the wafer 107 is processed.

Specifically, a second period in which a DC current having a small absolute value is supplied from the coil power supply units 114a to 114c exists right after a first period in which a DC current having a large absolute value is supplied therefrom. Then, as a group of periods including the first and second periods, a DC current having large and small values is supplied.

In the processing chamber 104, electron cyclotron resonance (ECR) is generated by the interaction between the electric field of the supplied microwave and the magnetic field from the solenoid coil 106 and the atoms and molecules of the processing gas supplied into the processing chamber 104 are excited. Then, plasma is formed in the processing chamber 104 by particles of the excited processing gas.

By using this plasma, processing is performed on a film layer of a multi-layer film structure including a mask layer formed in advance on the top surface of the wafer 107 and the film layer corresponding to the processing target.

During this process, a gas having heat transferability such as He is supplied to a gap between the back surface of the wafer 107 and the top surface of the dielectric film forming the placement surface of the sample stage 108 through a supply pipe disposed inside the sample stage 108. Further, a refrigerant is supplied to a passageway inside a metallic disc or a cylindrical member inside the sample stage 108 and flows therethrough.

Since the heat transferring gas is supplied, the transfer of the heat between the wafer 107 and the sample stage 108 having a refrigerant passageway through which a refrigerant flows is promoted. A pressure of the heat transferring gas or a temperature or pressure of the refrigerant flowing through the refrigerant passageway is adjusted so that a temperature of the wafer 107 falls within a range of a desired value suitable for processing.

In a state where the plasma is formed, predetermined high-frequency power is supplied from the high-frequency power supply unit 110 to the electrode disposed inside the dielectric film. Then, a bias potential is formed above the top surface of the wafer 107 in response to the potential of the plasma.

In response to a potential difference between the bias potential and the plasma, charged particles such as ions in the plasma are attracted toward the top surface of the wafer 107 and collide with the top surface. Thus, the processing of the film layer corresponding to the processing target and included in the film structure on the top surface of the wafer 107 is promoted in a desired direction.

During such processing of the wafer 107, light emitted from the inside of the processing chamber 104 including charged particles from the plasma is received by a light receiver through the window which constitutes the plasma monitor 102 and is disposed on the side wall of the vacuum container 115. By using the output, the intensity of the light having a wavelength corresponding to the reaction of the processing and its change in time are detected as data in time series in a control device (not illustrated) of the plasma processing apparatus 100.

In this embodiment, it is determined whether the processing has reached an end point by using a comparison result between this data and a predetermined value. The processing of the wafer 107 is continued until it is determined that the processing has reached the end point. When it is determined that the processing has reached the end point, the supply of the high-frequency power from the high-frequency power supply unit 110 to the sample stage 108 and the supply of the electric field and the magnetic field to the processing chamber 104 are stopped so that the plasma is extinguished and the processing of the wafer 107 is stopped.

After extinguishing the plasma, the electrostatic attraction force due to the DC power from the DC power supply unit 109 is reduced or eliminated. Then, a gate valve is opened and the wafer 107 is delivered onto the hand of the robot arm entered the processing chamber 104 from the transportation chamber.

Next, when there is a wafer 107 which is not processed in the processing target, the wafer 107 which has been processed is transported to the outside by the robot arm and the wafer 107 which is not processed and is placed on the hand of another arm is transported into the processing chamber 104 and is delivered onto the sample stage 108. When there is no wafer 107 which is not processed, the processing of the wafer 107 in the plasma processing apparatus 100 is stopped.

In this embodiment, the current values respectively supplied from the coil power supply units 114a to 114c to the solenoid coils 106a to 106c are set so that the absolute values become a plurality of values with time. In particular, the coil power supply units 114a to 114c respectively output a plurality of values only during a specific period corresponding to the values.

Then, a series of power supply patterns (which are modulated in time) in which the DC current is output in a specific order with a magnitude corresponding to the period with time are repeatedly changed during processing. Also, the magnetic fields respectively generated by the solenoid coils 106a to 106c are supplied into the processing chamber 104.

Further, in this embodiment, the magnitude and the period of the current output from the coil power supply units 114a to 114c are selected in advance so that a distribution of the intensity or density of the plasma formed inside the processing chamber 104 in the radial direction of the wafer 107 or the processing chamber 104 becomes a predetermined value every period.

Figure 10:
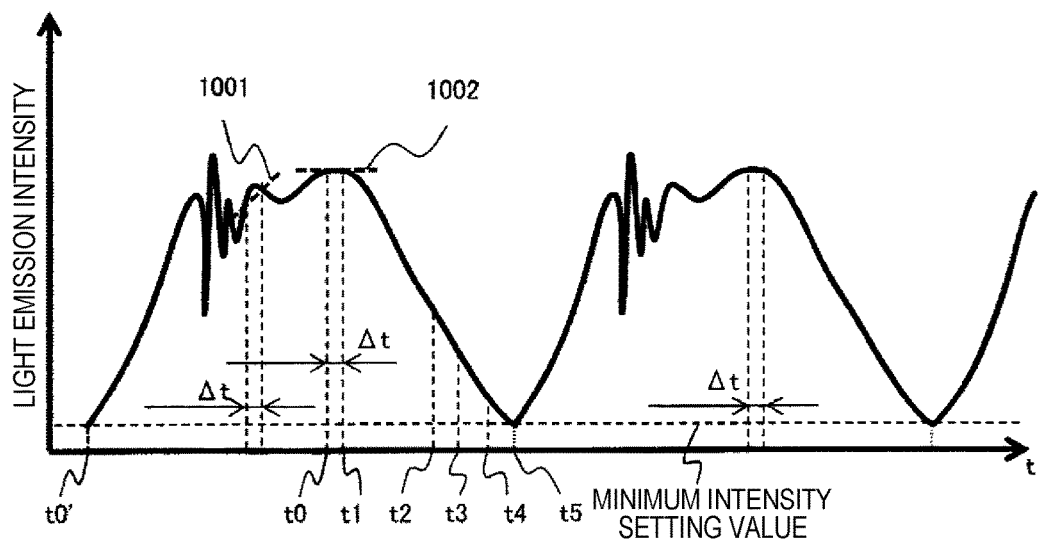
FIG. 10 is a graph illustrating a change with time in light emission intensity of plasma detected by a plasma monitor inside the processing chamber of the embodiment illustrated in FIG. 1.
Figure 11:
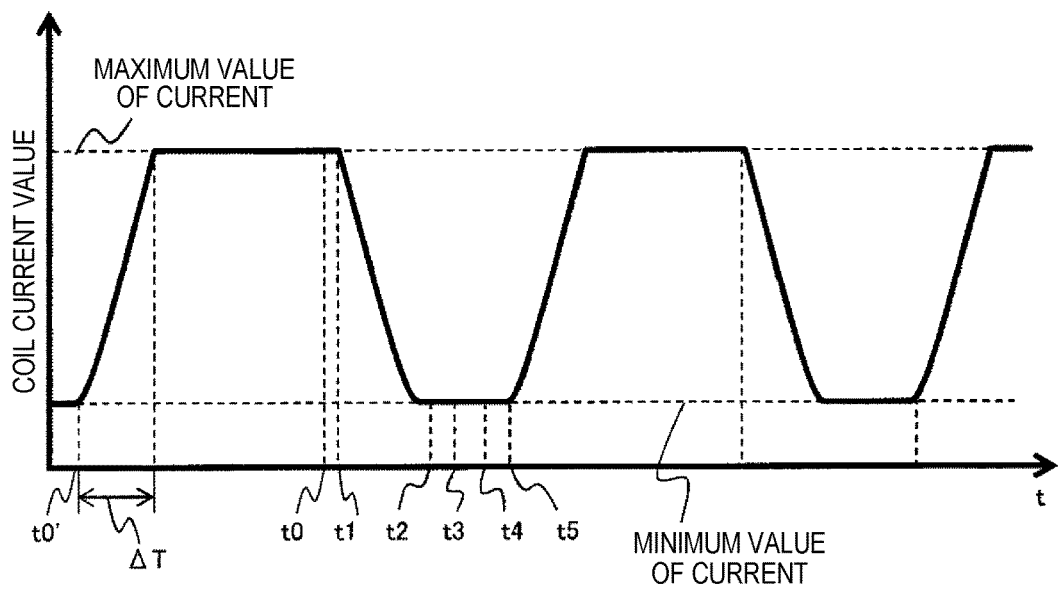
FIG. 11 is a graph illustrating a change with time in value of a current supplied to the solenoid coil of the embodiment illustrated in FIG. 1.

Next, a method of adjusting a current supplied to the solenoid coil in this embodiment will be described in detail with reference to FIGS. 10 and 11. FIG. 10 is a graph illustrating a change with time in light emission intensity of the plasma inside the detected processing chamber through the plasma monitor 102 of the embodiment illustrated in FIG. 1. FIG. 11 is a graph illustrating a change with time of a current value supplied to the solenoid coil in the embodiment illustrated in FIG. 1.

Additionally, in this example, the plasma monitor 102 which detects the light emission intensity of the plasma formed inside the processing chamber 104 and its change in time is used in order to acquire the data of FIG. 10. However, such a monitor is not limited to detecting the light emission and may be also used to detect typical characteristics of the plasma state such as the intensity of the plasma inside the processing chamber 104.

As an example of such detection means, means for detecting a value or amplitude of a DC voltage of the placement electrode 108 is exemplified.

In this embodiment, the controllers 113a to 113c which are respectively connected to the coil power supply units 114a to 114c to communicate therewith are configured to synchronously modulate the DC current supplied to the solenoid coils 106a to 106c on the basis of a result in which the light emission intensity of the plasma formed inside the processing chamber 104 is detected every predetermined sampling period Δt.

That is, as illustrated in FIG. 11, the DC current values respectively supplied from the coil power supply units 114a to 114c to the solenoid coils 106a to 106c respectively connected thereto start to be adjusted to become predetermined maximum values at a time t0' before a time t0. Due to the supply of the current, the solenoid coils 106a to 106c respectively form the magnetic field and thus plasma is formed inside the processing chamber 104 due to ECR.

The supplied current values are respectively adjusted by the coil power supply units 114a to 114c respectively receiving instruction signals from the controllers 113a to 113c. As illustrated in FIG. 11, in this example, the current value starts to rise from a predetermined minimum value at the time t0', reaches a predetermined maximum value after a time ΔT, and then is maintained at a constant value during a period including the time t0 to a time t1.

Next, the current values start to be adjusted so that the current values respectively supplied to the solenoid coils 106a to 106c become predetermined minimum values at the time t1 elapsed by Δt from the time t0 and are reduced to predetermined minimum values during a period of the time ΔT. Next, a state where the current value becomes minimal is maintained from a time t2 to a time t5.

Next, the DC current values respectively supplied to the solenoid coils 106a to 106c start to be adjusted to become predetermined maximum values at the time t5.

In this embodiment, a current having a large absolute value is supplied from the coil power supply units 114a to 114c during a period from t0' to t1 in the period from the time t0' to the time t5 during the processing of the wafer 107. Further, a current having a small absolute value is supplied from the time t1 to the time t5.

These periods include a time ΔT necessary for a transition to a time in which a current flowing in the coil reaches a predetermined maximum value (the intensity of the generated magnetic field becomes maximal) after the supply of the current having a large absolute value starts from the time t0'. Further, these periods include a transition period ΔT up to a time in which a current flowing in the coil reaches a predetermined minimum value (the intensity of the generated magnetic field becomes minimal) after the supply of the current having a small absolute value starts from the time t1.

Further, in this embodiment, an operation of a modulation (hereinafter, referred to as a time-modulation) of supplying power to the solenoid coils 106a to 106c or generating a magnetic field at different intensities in the solenoid coils only during a predetermined period is repeated during a period of the processing of the wafer 107. Particularly, in this embodiment, this operation is repeated during a period until an occurrence or an arrival of a condition of determining an end of a predetermined process is detected, the condition including an elapse time from a time at which the supply of the high-frequency power from the high-frequency power supply unit 110 to the plurality of electrodes inside the dielectric film of the sample stage 108 starts, a remaining film thickness or depth of the film layer corresponding to the processing target, or a change in light emission intensity of a specific wavelength.

In this example, one cycle is set as a period from the time t0' to the time t5 including a time in which a current is maintained at two values including a maximum value and a minimum value and a transition time thereof and the cycle is repeated until the determination of the occurrence of the process ending condition or the arrival (end point) of the target film thickness of the film corresponding to the processing target. Hereinafter, a method of adjusting the current supplied to the solenoid coils 106a to 106c of this example will be described in detail.

In this example, a current having a large absolute value is started from the time t0' and a state where a current value becomes maximal after ΔT in one cycle and the intensity or distribution of the plasma formed inside the processing chamber 104 reaches a normal state is detected by a control device (not illustrated) by the use of the output from the plasma monitor 102. A time at which this determination is made will be set as t1.

In this embodiment, data illustrating the light emitted from the inside of the processing chamber 104 and received by the plasma monitor 102 is detected as time-series data of the light emission intensity of the plasma every time during the processing of the interval Δt by the control device. Further, in the control device, the magnitude of the gradient of the temporal change of the intensity of the light emission is detected from the time-series data.

Data illustrating a gradient of a change in detected light emission intensity is stored inside the control device or a storage device such as a hard disk or a removable disk connected thereto by a wire or wireless communication means. Further, the data is compared with a reference data stored in the storage device in advance to determine whether the plasma changes largely or slightly.

More specifically, the data is compared with a gradient value AO stored or recorded in a storage device in advance as a reference value for determining a state where a gradient of a temporal change in light emission intensity of the plasma detected at a predetermined time during processing by a calculator inside the control device. When it is determined that the gradient of the temporal change in light emission intensity is small as a result of the comparison between the gradient of the temporal change in light emission intensity at the time and AO, it is determined that the plasma is normal.

FIG. 10 illustrates a dashed line 1001 indicating a gradient of a temporal change in light emission intensity of the plasma at the early plasma formation time in which the processing gas inside the processing chamber 104 is excited and the plasma is ignited and a dashed line 1002 indicating a gradient of a temporal change in transition of the light emission intensity from the plasma at a time point (from the time t0 to the time t1) of the period in which the plasma is ignited and the current supplied to the solenoid coils 106a to 106c is maintained at the maximum value. As illustrated in the drawings, at the early time immediately after the ignition of the plasma, the light emission intensity of the plasma changes largely and its change is small during a period of a time Δt from the time t0 to the time t1.

In this embodiment, the reference value AO of the above-described gradient is set to be smaller than that of the line 1001. For this reason, it is determined that the gradient of the temporal change in light emission intensity during the period of the time Δt from the time t0 detected at the time t1 is smaller than AO and the plasma reaches a normal state at the time t1.

Next, the current supplied to each of the solenoid coils 106a to 106c starts to be adjusted to become a predetermined minimum value after the control device determines that the intensity or distribution of the plasma reaches a normal state at the time t1. After the current decreases to a predetermined minimum value during a period of a time ΔT, the current is maintained at the minimum value.

In this embodiment, the current value is maintained at the minimum value until the light emission intensity of the plasma becomes smaller than a predetermined value so that the density or intensity of the plasma decreases to a degree in which the plasma disappears. A time t5 illustrated in FIGS. 10 and 11 indicates a time in which the light emission intensity of the plasma detected by the plasma monitor 102 becomes smaller than the predetermined minimum value and the substantial disappearing of the plasma is determined.

In this example, the reference value of the light emission intensity of the plasma is set in advance for the determination of disappearing similarly to the case of the determination for the normal state in this way. When the control device detects that the light emission intensity of the plasma obtained through the plasma monitor 102 becomes smaller than the corresponding value, it is determined that the plasma substantially disappears.

As illustrated in FIG. 10, the DC current values supplied to the solenoid coils 106a to 106c at the time t1 are decreased and the light emission intensity of the plasma is uniformly decreased while the minimum values are maintained. Then, it is detected that the current values become smaller than the set minimum intensity values at the time t5.

A change in light emission intensity of the plasma occurs since the plasma formed inside the processing chamber 104 undergoes disappearing of the ECR surface inside the processing chamber 104 or a remarkable decrease in its intensity when the supply of the DC current to the solenoid coils 106a to 106c is interrupted or the amount of the DC current is decreased at the time t1. That is, since the ECR surface disappears or the intensity decreases, the generation of charged particles or active species due to the excitation of the processing gas in the processing chamber 104 is damaged.

Further, the constraint by the magnetic field to the charged particles such as ions constituting the plasma or the magnetic force lines constituting the plasma is reduced. As a result, charged particles are diffused inside the processing chamber 104 from the time t1 onward toward an area having a relatively low density of the plasma at the time t1 or the outer peripheral side wall of the processing chamber 104.

Accordingly, the active species in the plasma are also diffused and the light emission intensity of the plasma is decreased. The time at which the light emission intensity of the plasma decreasing in accordance with this diffusion reaches a predetermined minimum reference value for determination is t5.

Next, the DC current supplied to each of the solenoid coils 106a to 106c starts to be adjusted to a predetermined maximum value immediately after the time t5 at which the light emission intensity of the plasma becomes equal to or smaller than the minimum reference value for determination. That is, in this embodiment, one cycle includes the time t0' to the time t5 and two large and small DC current values are set as target values. The cycle is repeated so that the DC current is supplied only during a period from the time t0' to the time t1 or the time t1 to the time t5 and the current is supplied to the solenoid coils 106a to 106c.

A time of starting and ending the period of the cycle of the time t0', the time t1, the time t5, and the like may be set before the start of the processing of the product wafer 107 from a result obtained by the plasma monitor 102 after processing a test wafer having a film structure with the same configuration (type and dimension) as that of the product wafer 107 in advance. The control device may set the predetermined time or the time interval and increase or decrease the absolute value of the current every interval from the processing start time.

Further, the light emission intensity of the plasma detected by the plasma monitor 102 during the processing of the product wafer 107 and it change amount with time are compared with predetermined reference values to determine a period of supplying a current having a different absolute value, a time point of adjusting the current value, or the arrival of the end point. Based on this result, the current value and the magnetic field intensity may be adjusted.

Further, the time ΔT indicates a time necessary for the transition until the current supplied to the solenoid coils 106a to 106c flows therein at a desired value or the magnetic field is formed by the current having the desired value. It is desirable to shorten such a time from the viewpoint of the processing throughput of the wafer 107.

For this reason, the controllers 113a to 113c may include mechanisms capable of instantaneously applying a reverse current when attenuating and enhancing the current supplied to the solenoid coils 106a to 106c to shorten the rise time of the current.

As a comparative example of the embodiment, a change in plasma distribution inside the processing chamber 104 of the plasma processing apparatus according to the related art which does not supply the magnetic field while modulating the magnetic field in time unlike the embodiment will be described with reference to FIGS. 2(a) to 3(b).

FIGS. 2(a) and 3(a) are longitudinal sectional views schematically illustrating a configuration of a plasma processing apparatus according to the related art. Further, FIGS. 2(b) and 3(b) are graphs schematically illustrating a distribution of characteristics of processing performed on the wafer inside the plasma processing apparatus according to the related art illustrated in FIGS. 2(a) and 3(a).

Also in the related art illustrated in the drawings, a disc-shaped dielectric window member 205 is disposed to air-tightly seal the inside and the outside of a processing chamber 204 while covering the cylindrical processing chamber 204 disposed inside the processing container 215 from above. Further, an electric field of a microwave transferred inside a cylindrical cavity 203' disposed above the window member 205 and a waveguide 203 communicating therewith passes through the window member 205 and is supplied into the processing chamber 204.

Further, three annular solenoid coils 206a, 206b, and 206c are disposed to cover the outer periphery of the side wall of the processing container 215 and the upper side of the window member 205 or the cavity 203'. A DC current is supplied from coil power supply units 214a, 214b, and 214c electrically connected to the annular solenoid coils and the solenoid coils supply the magnetic field formed by the solenoid coils 206a, 206b, and 206c into the processing chamber 204.

Further, atoms or molecules or a gas introduced into the processing chamber 204 from a gas introduction hole (not illustrated) are excited in an ECR (Electron Cyclotron Resonance) surface 223 formed inside the processing chamber 204 and a peripheral space including the surface by the interaction of the magnetic field and the electric field of the microwave and plasma 222 is generated by the excitation. The movement of charged particles in the plasma 222 is restrained by the ECR surface 223 and the magnetic force line 221 of the magnetic field.

For this reason, charged particles move inside the processing chamber 204 in a direction of the magnetic force line 221 and collide with a top surface of a wafer 207 placed and held on a substantially cylindrical top surface of a cylindrical sample stage 208. By the action of the charged particles, the etching of a film layer corresponding to a processing target of a multi-layer film structure including a mask layer formed of resin or the like and disposed on the top surface of the wafer 207 and the film layer corresponding to the processing target is promoted.

In this comparative example, as illustrated in FIG. 2(a), the particles of the plasma 222 on the ECR surface 223 are integrated at the center portion of the processing chamber 204 so that the density at the outer peripheral side is remarkably smaller than that of the center portion. Accordingly, the particles mainly exist at the center. Also in this case, the number (density) of the particles existing per unit area in the plasma 222 and reaching the top surface of the wafer 207 is high at the center portion of the wafer 207 so that the value is maximal at the center portion and the number (density) decreases as it goes toward the outer peripheral end of the wafer 207 in the outer peripheral area, thereby obtaining a so-called high-middle distribution.

This is because the movement of the charged particles in the plasma 222 is restrained by the magnetic force line 221 as described above and the magnetic force line 221 inside the processing chamber 204 above the sample stage 208 has a downward funnel-shaped distribution toward the wafer 207. Then, the charged particles of the plasma 222 formed at the center portion are diffused toward the outer peripheral end of the wafer 207 while moving downward.

For this reason, an etching speed for the top surface of the wafer 207 of this example has a non-uniform radial distribution such that the etching speed is the highest at the center portion of the wafer 207 and becomes lower as it goes toward the outer peripheral portion as illustrated in FIG. 2(b).

Next, an example illustrated in FIG. 2(a) in which the plasma 222 intensively exists at the center portion will be described with reference to FIG. 3(a) on the base of a processing distribution in a case where annular plasma is formed in the periphery of the center portion of the vacuum container.

In this example, as illustrated in FIG. 3(a), an area having a high density or intensity of plasma 322 formed inside a processing chamber 304 is located in an annular shape above a sample stage 308 by an electric field of a microwave supplied from a waveguide 303 into a processing chamber 304. In such a condition, the number (density) per unit area of particles in the plasma reaching a top surface of a wafer 307 has a distribution in which the number (density) is low at the center portion and the outermost peripheral portion in the radial direction of the top surface of the wafer 307 and is high in an area therebetween.

For this reason, a change in etching speed in the radial direction of the top surface of the wafer 307 has a so-called M-shaped non-uniform distribution in which the etching speed is low at the center portion and the outermost peripheral portion and is the highest therebetween as illustrated in FIG. 3(b).

Meanwhile, the plasma processing apparatus 100 illustrated in FIG. 1 is configured to time-modulate a DC current supplied from each of the DC power supply units 113a, 113b, and 113c to the solenoid coils 114a, 114b, and 114c of which the centers in the longitudinal sectionals are disposed at three different positions in the vertical direction. In the example to be described below, for the sake of simplicity, the time-modulated current value will be described by an example in which a signal indicating the current value has a pulse waveform in which predetermined minimum and maximum values are continuously output during each predetermined period.

In this embodiment, the DC current having an adjusted value may be supplied to the solenoid coils 106a to 106c on the basis of the time-modulation in which the minimum value of the DC current is a limited absolute value other than zero.

In this way, an etching speed distribution of the top surface of the wafer 107 and a plasma area in a case where the time and the intensity of the electric field or the magnetic field supplied into the processing chamber 104 is adjusted will be described with reference to FIGS. 4(a) to 6(b). Further, in the following description, the time t0 to the time t5 respectively correspond to the same times described in FIGS. 10 and 11.

FIG. 4(a) is a longitudinal sectional view schematically illustrating an area of plasma 401 formed inside the processing chamber 104 at the time (t0) in which the DC power having a maximum value is supplied from the coil power supply unit 113 to the solenoid coil 106 in the plasma processing apparatus 100 according to the embodiment of the invention. In the state of FIG. 4(a), the plasma 401 is generated by the excitation of the particles of the processing gas introduced into the processing chamber 104 by electron cyclotron resonance (ECR) generated inside the processing chamber 104 during a period in which a current having a maximum value is supplied to the solenoid coils 106a to 106c.

An area inside the processing chamber 104 with the plasma 401 at this time is the same as that of FIG. 2(a). That is, a magnetic force line 402 of the magnetic field obtained by the combination of the magnetic fields generated by the solenoid coils 106a to 106c is formed in a symmetrical shape around the vertical center axis of the processing chamber 104 and a downward funnel shape.

Meanwhile, the movement direction of charged particles in the plasma 401 formed inside the processing chamber 104 is restrained in the direction of the magnetic force line 402. For this reason, the density or intensity of the plasma 401 formed by electron cyclotron resonance has a distribution in which the density or intensity is the highest at the center portion of the processing chamber 104 and decreases as it goes toward the outer peripheral side.

The etching speed at each position on the top surface of the wafer 107 placed and held on the top surface of the sample stage 108 placed under the plasma 401 and the magnetic force line 402 in the radial direction has a distribution in which the etching speed is the highest at the center portion and decreases toward the outer peripheral side.

As illustrated in FIGS. 10 and 11, in this embodiment, the DC current values respectively supplied from the coil power supply units 114a to 114c to the solenoid coils 106a to 106c repeatedly become two large and small values at the respective time intervals in a synchronization manner by the operations of the controllers 113a to 113c. In the examples illustrated in FIGS. 4(a) to 6(b), an operation of decreasing the current value toward the minimum value is started at the time t1 elapsed by t1 seconds from the time t0 in which the current value is the maximum value.

In a state where the current value is minimal in this example, the magnetic fields generated from the solenoid coils 106a to 106c cannot restrain the movement direction of charged particles such as ions in the plasma 401 inside the processing chamber 104 and the magnetic field is not substantially supplied to the processing chamber 104 (an OFF state). The current values supplied to the solenoid coils 106a to 106c may be set to zero at the time t1 and may be maintained until the time t5.

FIG. 4(b) is a longitudinal sectional view schematically illustrating an area provided with the plasma 403 inside the processing chamber 104 at the time (the time t2) elapsed from the time t1 by an arbitrary time of ΔT or more. At the time t1, the current supplied to the solenoid coils 106a to 106c has the minimum value by the controllers 113a to 113c and the magnetic field supplied to the processing chamber 104 substantially disappears.

For this reason, the restraint of the movement direction of charged particles inside the plasma 401 due to the magnetic force line 402 decreases or disappears and hence the charged particles move inside the processing chamber 104 by the diffusion according to the free movement compared to the magnetic force line 402. As a result, in an area provided with the plasma 403, particles of the plasma 401 are diffused toward an area having a low density during a period having the magnetic field in accordance with the density gradient.

At the time after the time t1, particles of the plasma 401 integrated at the center portion of the processing chamber 104 move toward the outer peripheral side. For this reason, the density of the plasma at the center portion of the top surface of the wafer 107 decreases and increases at the outer peripheral area.

That is, compared to the etching speed distribution in the radial direction of the wafer 107 or the processing chamber 104 of the density of the plasma at the time t0, the etching speed distribution at the time from the time t2 onward is set such that the etching speed at the center portion is small and the etching speed increases at the outer peripheral position in a direction from the center of the top surface of the wafer 107 toward the outer periphery. That is, the distribution has an M shape.

In this drawing and the following drawings, an area having plasma is indicated as a hatched part, but this hatched part merely and schematically illustrates an area where the density is higher than others. That is, it does not mean that the particles constituting the plasma do not exist in the area which is not hatched in these examples and modified examples.

FIG. 5(a) is a longitudinal sectional view schematically illustrating an area provided with plasma 501 inside the processing chamber 104 at a time (time t3) elapsed from the time t2 by an arbitrary time. In this embodiment, from the time t1 to the time t3, the DC current values respectively supplied from the coil power supply units 114a to 114c to the solenoid coils 106a to 106c are minimal and the magnetic field is not substantially supplied to the processing chamber 104 (an OFF state).

In this example, the supplied DC current may be zero, that is, the supply of the DC current may be stopped. At this time, the magnetic force line is not substantially formed inside the processing chamber 104.

For this reason, the plasma 501 in FIG. 5(a) has a shape in which a relative high-density area of the plasma 403 further extends toward the outer periphery of the processing chamber 104 compared to the plasma 403 at the time t2 of FIG. 4(b). In the distribution, the density at the center portion of the processing chamber 104 is smaller than that of the plasma 403 and the high-density area further moves toward the outer peripheral area.

That is, the distribution of the density of the plasma 501 is set such that a position having a maximum density in the radial direction of the wafer 107 further moves to the outer peripheral side of the wafer 107 compared to the plasma 403 at the time t2. For this reason, the etching speed distribution on the top surface of the wafer 107 located at the lower position is set such that the etching speed is the highest at the outer peripheral position compared to the case of FIG. 4(a) in the radial direction from the center of the wafer 107 toward the outer periphery thereof and decreases from that position toward the center and the outer periphery.

FIG. 5(b) is a longitudinal sectional view schematically illustrating plasma 502 formed inside the processing chamber 104 of the plasma processing apparatus 100 of this embodiment at the time (t4) elapsed from the time t3 by a predetermined time. From the time t3 to the time t4 of this embodiment, the DC current values respectively supplied from the coil power supply units 114a to 114c to the solenoid coils 106a to 106c become minimal similarly to the above-described time t1 to t3 and the magnetic field supplied into the processing chamber 104 is substantially zero, that is, the supply of the magnetic field is stopped.

That is, the magnetic force line of charged particles inside the processing chamber 104 is not substantially formed inside the processing chamber 104. For this reason, the charged particles inside the processing chamber 104 move inside the processing chamber 104 by a diffusion according to a free movement compared to the magnetic force line 402.

The plasma 502 of FIG. 5(b) is further diffused toward the outer periphery of the processing chamber 104 from an area provided with the plasma 501 at the time t3 of FIG. 5(a). Compared to the distribution of the plasma 501 at the time t3, the plasma density distribution is set such that the density value at the center portion of the processing chamber is low and the plasma reaches the wall of the processing chamber.

In this embodiment, a position having a maximum density of the plasma 502 at a position in the radial direction from the center of the top surface of the wafer 107 toward the outer periphery at the time t4 extends to the outer peripheral edge of the wafer 107 or the outermost peripheral position to be processed as the outer periphery of the product. For this reason, the etching speed distribution on the top surface of the wafer 107 at the position in the radial direction between the center and the outer peripheral edge of the processing chamber 104 or the top surface of the wafer 107 at the time t4 is set such that the etching speed is the lowest at the center, is the highest at the outer peripheral edge of the wafer 107, and increases from the center toward the outer peripheral edge.

FIG. 6(a) is a longitudinal sectional view schematically illustrating a plasma area inside the processing chamber 104 of the plasma processing apparatus 100 of this embodiment at the time (t5) elapsed from the time t4 by a predetermined time. In this embodiment, also at the time t4 to the time t5, the DC current values respectively supplied from the coil power supply units 114a to 114c to the solenoid coils 106a to 106c are minimal similarly to the time t1 to t4 and the magnetic field formed therefrom and supplied into the processing chamber 104 is substantially zero, that is, the supply of the magnetic field is stopped.

For this reason, the magnetic field is not substantially supplied into the processing chamber 104 and the plasma illustrated in FIG. 5(b) inside the processing chamber 104 is further diffused from the plasma 502 at the time t5. In this example, the plasma is continuously diffused after the time t4. Then, a position having the highest plasma density in the radial direction of the wafer 107 or the processing chamber 104 moves toward the outer periphery of the processing chamber 104 compared to the plasma 502 and reaches the inner wall surface of the cylindrical side wall of the upper portion of the vacuum container 115 surrounding the discharging chamber of the processing chamber 104 before the time t5.

In general, when particles in the plasma collide with a surface of a low-temperature member, its potential energy disappears. In the embodiment illustrated in FIG. 6(b), since most of active particles excited at the time t5 contact the inner wall surface of the side wall and lose excited energy, the light emission intensity of the plasma detected by the plasma monitor 102 becomes smaller than a reference value for determining that the plasma substantially contributing to the processing is not formed.

A temporal change in etching speed distribution in the top surface of the wafer 107 processed in this embodiment having such a change in plasma distribution is as below. That is, the etching speed is the largest at the center portion of the wafer 107 from the time t0 to t1 in which the magnetic field is supplied from the solenoid coils 106a to 106c into the processing chamber 104.

A position where the etching speed is maximal in the radial direction of the wafer 107 or the processing chamber 104 gradually moves from the center of the wafer 107 or the processing chamber 104 toward the outer periphery of the radial direction with the diffusion of the plasma during a period from the time t1 to the time t4 in which the supply of the magnetic field or the formation of the magnetic force line is stopped or the magnetic field decreases to a degree in which the stop of the supply or formation of the magnetic field is detected. Next, since the amount in which the plasma reaches the outermost peripheral edge of the wafer 107 and disappears at the side wall surface of the processing chamber 104 at the time t5 increases and the etching cannot be substantially performed, the etching speed becomes zero on the whole.

That is, the etching speed of the top surface of the wafer 107 uniformly decreases from the maximum value at the center portion with time during a period of the time t0 to t5. Further, the etching speed uniformly increases from a state where the value of the outer peripheral edge is the lowest. After the etching speed becomes maximal, the etching speed rapidly decreases.

In this embodiment, a magnetic field for generating plasma by ECR inside the processing chamber 104 is supplied during a period including the time t0 to t1 as described above and the supply of the magnetic field into the processing chamber 104 is decreased or stopped during a period from the time t2 to the time t5 while the wafer 107 is processed. The periods t0 to t1 and the periods t2 to t5 are respectively included in the first period from t0' to t1 in which the DC current supplied from each of the coil power supply units 114a to 114c to each of the solenoid coils 106a to 106c increases from the minimum value, becomes the maximum value, and is maintained at the maximum value and the second period from t1 to t5 in which the DC current decreases from the maximum value to the minimum value and is maintained at the minimum value.

During the processing of the wafer 107, the cycle of the supply of the DC power from the coil power supply units 114a to 114c or the supply of the magnetic field from the solenoid coils 106a to 106c to the processing chamber 104 is repeated at a predetermined time interval while a group of two periods is set. As a result, a period of supplying the magnetic field forming the plasma into the processing chamber 104 and a period of not substantially supplying the magnetic field are alternately repeated during the processing of the wafer 107.

In the above-described embodiment, the electric field of the microwave supplied to the processing chamber 104 during the processing of the wafer 107 may be generated from the microwave generation power supply unit 101 or may be supplied from the waveguide 103 into the processing chamber 104 to have a uniform intensity regardless of the cycle of the supply of the DC power from the coil power supply units 114a to 114c to the processing chamber 104 or the supply of the magnetic field from the solenoid coils 106a to 106c to the processing chamber. Alternatively, the electric field generation or intensity value may be increased or decreased so as to correspond to the cycle of the supply of the DC power or the supply of the magnetic field.

Particularly, the electric field of the microwave may be generated from the microwave generation power supply unit 101 or may be supplied from the waveguide 103 into the processing chamber 104 according to a cycle synchronized with the above-described cycle while having large and small intensity values or two intensity values including a predetermined value and zero. In the above-described embodiment, the electric field of the microwave has a uniform intensity regardless of the cycle of the generation or the supply of the magnetic field and is supplied into the processing chamber 104.

A distribution of the density or the intensity as the time average of the plasma formed inside the processing chamber 104 of the plasma processing apparatus 100 operated as described above with time is formed so that a bias in a direction from the center of the processing chamber 104 toward the inner wall surface is suppressed. For this reason, the etching speed as the time average on the top surface of the wafer 107 during the etching using the plasma is uniform as illustrated in FIG. 6(b) or the bias is reduced compared to those of FIGS. 2(b) and 3(b) so that the distribution substantially becomes uniform.

The embodiment illustrated in FIGS. 4(a) to 6(b) has a configuration in which the plasma 401 is intensively formed at an area of the center portion of the processing chamber 104. Next, as a modified example of this embodiment, an example of adjusting an area provided with the plasma by changing the power supplied to the solenoid coil with time in a configuration in which the plasma inside the processing chamber 104 is intensively formed in an annular shape around the vertical center axis of the processing chamber 104 will be described with reference to FIGS. 7(a) to 9(b).

Figure 7A:
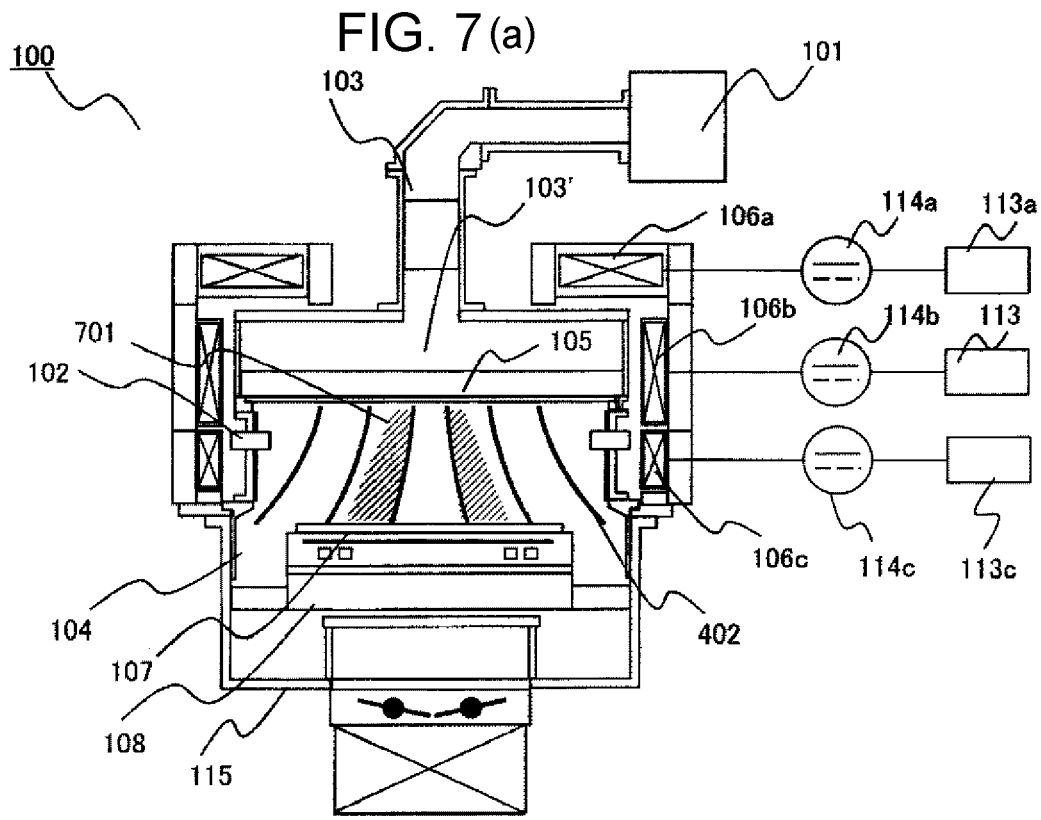
FIGS. 7(a) and 7(b) are a longitudinal sectional view schematically illustrating a plasma area formed inside a processing chamber at a specific time in which DC power is supplied from a coil power supply unit to a solenoid coil in a plasma processing apparatus according to a modified example of the embodiment illustrated in FIG. 1.
Figure 7B:
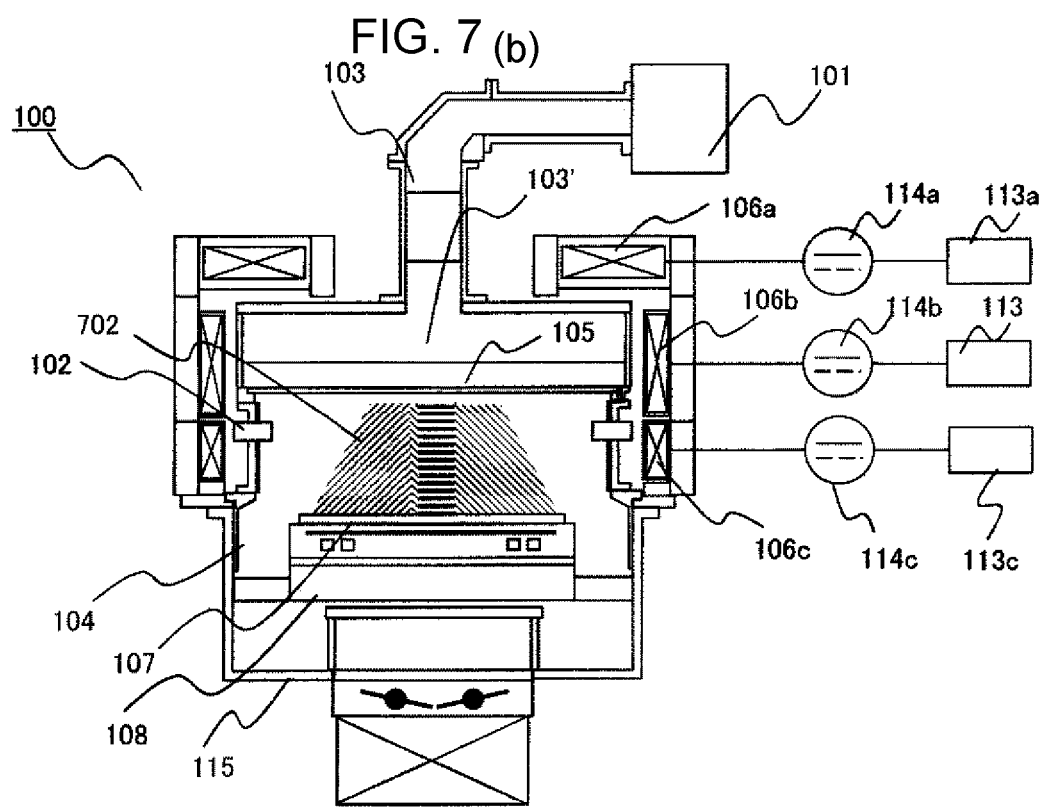

FIGS. 7(a) and 7(b) are a longitudinal sectional view schematically illustrating an area provided with plasma formed inside a processing chamber in a plasma processing apparatus according to a modified example of the embodiment illustrated in FIG. 1. Also in this example, maximum DC power values are respectively supplied from the coil power supply units 114a to 114c to the solenoid coils 106a to 106c during a period from the arbitrary time t0 to t1 and the supply of the DC power is stopped or decreased during a period from the time t2 to t5 while the film layer corresponding to the processing target on the top surface of the wafer 107 is etched.

Then, these two periods are continuously and alternatively repeated until a control device (not illustrated) detects an end point of the processing after the start of the etching process. FIG. 7(a) is a longitudinal sectional view schematically illustrating an area of plasma 701 formed inside the processing chamber 104 at the time (t0) in which the maximum DC power values are respectively supplied from the coil power supply units 114a to 114c to the solenoid coils 106a to 106c in the plasma processing apparatus 100 corresponding to the etching apparatus particularly using plasma by ECR.

While the maximum current values are supplied to the solenoid coils 106a to 106c, the plasma 701 is generated on the ECR surface formed by electron cyclotron resonance (ECR) generated inside the processing chamber 104 by the magnetic fields supplied from the solenoid coils 106a to 106c. The plasma 701 of this example is formed in an annular shape around the vertical center axis of the discharging chamber which is the plasma forming space above the sample stage 108 of the processing chamber 104 in which a relatively high-density area has a cylindrical shape.

The plasma 701 is realized so that the plasma 701 has a maximum value corresponding to the highest density at a position separated from the center axis of the processing chamber 104 by a predetermined distance in the radial direction of the wafer 107 in the ECR surface formed at an arbitrary height above the top surface of the sample stage 108 of the processing chamber 104 in accordance with the adjustment of the intensity of the magnetic field formed by the combination of the magnetic fields respectively generated by the solenoid coils 106a to 106c. Further, the plasma 701 has a distribution in which the density decreases as the distance from the corresponding position increases toward the center or the outer periphery of the wafer 107 in the radial direction.

Inside the processing chamber 104, a magnetic force line 702 having a downward funnel-shaped distribution to be symmetrical with respect to the center axis of the processing chamber 104 is formed inside the processing chamber 104 by the magnetic fields generated by the solenoid coils 106a to 106c. Then, the movement direction of charged particles in the plasma 701 is restrained in the direction of the magnetic force line 702.

For this reason, the etching speed distribution at each position in the radial direction from the center of the top surface of the wafer 107 absorbed and held onto the top surface of the sample stage 108 below the discharging chamber toward the outer periphery has the highest value (a maximum value) at a certain position between the center and the outer peripheral edge. Further, the distribution is formed so that the etching speed decreases as it goes away from the maximum position at the center side or the outer peripheral side of the corresponding position.

Next, an area provided with the plasma moving inside the processing chamber 104 at the time form the time t1 onward when the supply of the DC current supplied from the coil power supply units 114a to 114c to the solenoid coils 106a to 106c at the time t1 elapsed from the time t0 by a predetermined time in this example will be described with reference to FIGS. 7(b) to 9(b). FIG. 7(b) is a longitudinal sectional view schematically illustrating an area provided with the plasma inside the processing chamber 104 at the time t1 of the plasma processing apparatus of this example.

Further, FIG. 8(a) is a longitudinal sectional view schematically illustrating an area provided with the plasma inside the processing chamber 104 at the time t2 elapsed from the time t1 by a predetermined time and FIG. 8(b) is a longitudinal sectional view schematically illustrating an area provided with the plasma at the time t3 after the time t2. In addition, FIG. 9(a) is a longitudinal sectional view schematically illustrating an area provided with the plasma inside the processing chamber 104 at the time t4 after the time t3 and FIG. 9(b) is a longitudinal sectional view schematically illustrating an area provided with the plasma at the time t5 after the time t4.

In FIG. 7(b), an area of the plasma 702 formed inside the processing chamber 104 at the time t2 elapsed from the time t1 by a predetermined time is hatched. In this example, similarly to the above-described embodiment, the maximum DC current values supplied to the solenoid coils 106a to 106c start to be decreased at the time t1 and are continuously decreased up to the time t2.

Then, in the period of the time t1 to t2, the magnetic force line 402 formed by the magnetic field inside the processing chamber 104 before the time t1 is reduced and thus the restraint of the movement direction of charged particles in the plasma 702 is reduced. The charged particles at a high-density area of the plasma 702 at the time t1 are diffused toward a low-density area according to the density gradient at the time t1.

For this reason, the plasma 701 which is intensively formed in an annular shape around the center axis at the radial position separated by a predetermined distance from the vertical center of the processing chamber 104 on the ECR surface inside the processing chamber 104 from the time t0 to the time t1 is diffused toward the center side and the outer peripheral side having a low density from a specific position in the radial direction from the time t1 onward. For this reason, even in the top surface of the wafer 107, the density of the highly active particles in the plasma reaching a position in the radial direction between the outer peripheral edge and the center corresponding to the specific position decreases and the density of the particles at the center and the outer periphery increases.

For this reason, the etching speed of the top surface of the wafer 107 has a distribution in which a value at the position in the radial direction between the outer peripheral edge and the center corresponding to the specific position decreases compared to that of the time t0 and the etching speed at the center side and the outer peripheral side increases.

FIG. 8(a) schematically illustrates an area provided with plasma 801 inside the processing chamber 104 at the time t3 further elapsed from the time t2. Also in this modified example, the DC power supplied from the coil power supply units 114a to 114c to the solenoid coils 106a to 106c from the time t2 to the time t3 becomes zero or a predetermined minimum value similarly to the embodiment.

At this time, plasma having an intensity or density only etching the wafer 107 by the magnetic fields supplied from the solenoid coils 106a to 106c into the processing chamber 104 is not formed and the magnetic field is not substantially supplied into the processing chamber 104 at the time t3 after the time t2. For this reason, in the plasma 801 at the time t3, the restraint of the movement direction of charged particles due to the magnetic force line is reduced compared to the plasma 702 at the time t2 and hence charged particles are freely diffused.

For this reason, since charged particles of the plasma 801 are diffused to the center side and the outer peripheral side of the processing chamber 104 which is a relatively low-density area in the plasma 701 during the period of the time t2 to t3, a distribution is obtained in which an area with higher density or intensity than the plasma 701 moves to the outer peripheral side. Further, in this example, the density or intensity of the plasma 801 at the center portion decreases.

For this reason, a position where the density of particles of the plasma 801 becomes maximal at the time t3 reaching the top surface of the wafer 107 moves to the outer peripheral side compared to that of the time t2. Then, a distribution is obtained in which the density decreases as a distance from the maximum position at the center side and the outer peripheral side increases, that is, as it becomes closer to the center or the outer peripheral edge.

FIG. 8(b) schematically illustrates an area provided with the plasma 802 inside the processing chamber 104 at the time t4 further elapsed from the time t3. Also in this example, the DC power supplied to the solenoid coils 106a to 106c from the time t3 to the time t4 is a predetermined minimum value or zero similarly to the embodiment.

For this reason, the magnetic fields generated by the solenoid coils 106a to 106c are not substantially supplied into the processing chamber 104 also during the period of the time t3 to t4 similarly to the time t2 to t3. Accordingly, since the plasma 802 is further diffused compared to the plasma 801 at the time t3 so that the density at the center portion of the processing chamber 104 further decreases, a position where the density becomes maximal in the radial direction of the wafer 107 or the processing chamber 104 moves toward the outer periphery.

In this example, a position where the density of the plasma 802 becomes maximal at a position in the radial direction from the center of the top surface of the wafer 107 toward the outer periphery thereof at the time t4 reaches the outermost peripheral position corresponding to the outer peripheral edge or the outer periphery of the product wafer 107. For this reason, the etching speed distribution at a position in the radial direction from the center of the top surface of the wafer 107 toward the outer periphery thereof at the time t4 is set such that the etching speed becomes the highest at the outer peripheral edge of the wafer 107 and decreases toward the center.

FIG. 9(a) schematically illustrates a plasma state inside the processing chamber 104 at the time t5 further elapsed from the time t4. In this embodiment, also at the time t4 to the time t5, the absolute value of the DC current supplied from each of the coil power supply units 114a to 114c to each of the solenoid coils 106a to 106c becomes a minimum value or zero similarly to the time t2 to t4.

For this reason, the magnetic field is not substantially supplied into the processing chamber 104 also during the period of the time t4 to t5. At the time t5, the plasma inside the processing chamber 104 is further diffused from the plasma 802 illustrated in FIG. 8(b).

In this example, the plasma is continuously diffused after the time t4 so that a position having the highest density of the plasma in the radial direction of the wafer 107 or the processing chamber 104 moves toward the outer periphery of the processing chamber 104 compared to the plasma 802, and reaches the inner wall surface of the cylindrical side wall of the upper portion of the vacuum container 115 surrounding the discharging chamber of the processing chamber 104 before the time t5. At the time t5, most of particles in the plasma activated by excitation contact the inner wall surface of the side wall so that the excited energy disappears.

As a result, data corresponding to the time t5 of the light emission intensity of the plasma detected through the plasma monitor 102 is lower than a reference for determining that the plasma substantially contributing to the processing is not formed.

A temporal change in etching speed distribution on the top surface of the wafer 107 processed in this embodiment in which the plasma distribution changes in this way is as below. That is, the etching speed becomes maximal at a specific position between the center and the outer peripheral edge in the radial direction of the wafer 107 at the time t0 to t1 in which the maximum DC current values are supplied from the coil power supply units 114a to 114c and the magnetic fields are supplied from the solenoid coils 106a to 106c into the processing chamber 104.

A position where the etching speed becomes maximal in the radial direction of the wafer 107 or the processing chamber 104 gradually moves from the center of the wafer 107 or the processing chamber 104 toward the outer periphery in the radial direction in accordance with the diffusion of the plasma during the period from the time t1 to the time t4 in which the supply of the magnetic field or the formation of the magnetic force line is stopped or the magnetic field substantially decreases. Next, since the amount of the plasma disappeared at the side wall surface of the processing chamber 104 increases at the time t5 after reaching the outermost peripheral edge of the wafer 107 so that the etching cannot be substantially performed, the etching speed substantially becomes zero.

That is, the etching speed of the top surface of the wafer 107 uniformly decreases from the center portion having a maximum value with time during the period from the time t0 to t5. Further, the etching speed uniformly increases to become maximal from a state where the etching speed at the outer peripheral edge is the lowest and suddenly decreases. Also in this example, the magnetic field for generating the plasma by ECR inside the processing chamber 104 is supplied during the period including the time t0 to t1 and the supply of the magnetic field into the processing chamber 104 is reduced or stopped during the period from the time t2 to the time t5 while the wafer 107 is processed.

The period t0 to t1 and the period t2 to t5 include a first period of t0' to t1 in which the DC current supplied from each of the coil power supply units 114a to 114c to each of the solenoid coils 106a to 106c increases from the minimum value to become the maximum value and is maintained at the maximum value and a second period of t1 to t5 in which the DC current decreases from the maximum value to the minimum value and is maintained at the minimum value. During the processing of the wafer 107, a group of two periods is set as one cycle and the cycle is repeated at a predetermined time interval.

As a result, a period of supplying the magnetic field forming the plasma into the processing chamber 104 and a period of not substantially supplying the magnetic field are alternately repeated during the processing of the wafer 107. Also in this example, the electric field of the microwave supplied to the processing chamber 104 during the processing of the wafer 107 has a uniform intensity regardless of the cycle including the supply of the DC power from the coil power supply units 114a to 114c or the supply of the magnetic field from the solenoid coils 106a to 106c to the processing chamber 104 and including two repeated periods and the electric field is generated from the microwave generation power supply unit 101 or is supplied from the waveguide 103 into the processing chamber 104.

In response to the cycle of the supply of the DC power or the supply of the magnetic field, the electric field generation or intensity value may be increased or decreased. In particular, at a cycle synchronized with the corresponding cycle, the electric field of the microwave having large and small intensity values or two intensity values including a predetermined value and zero may be generated from the microwave generation power supply unit 101 or may be supplied from the waveguide 103 into the processing chamber 104.

Figure 2:
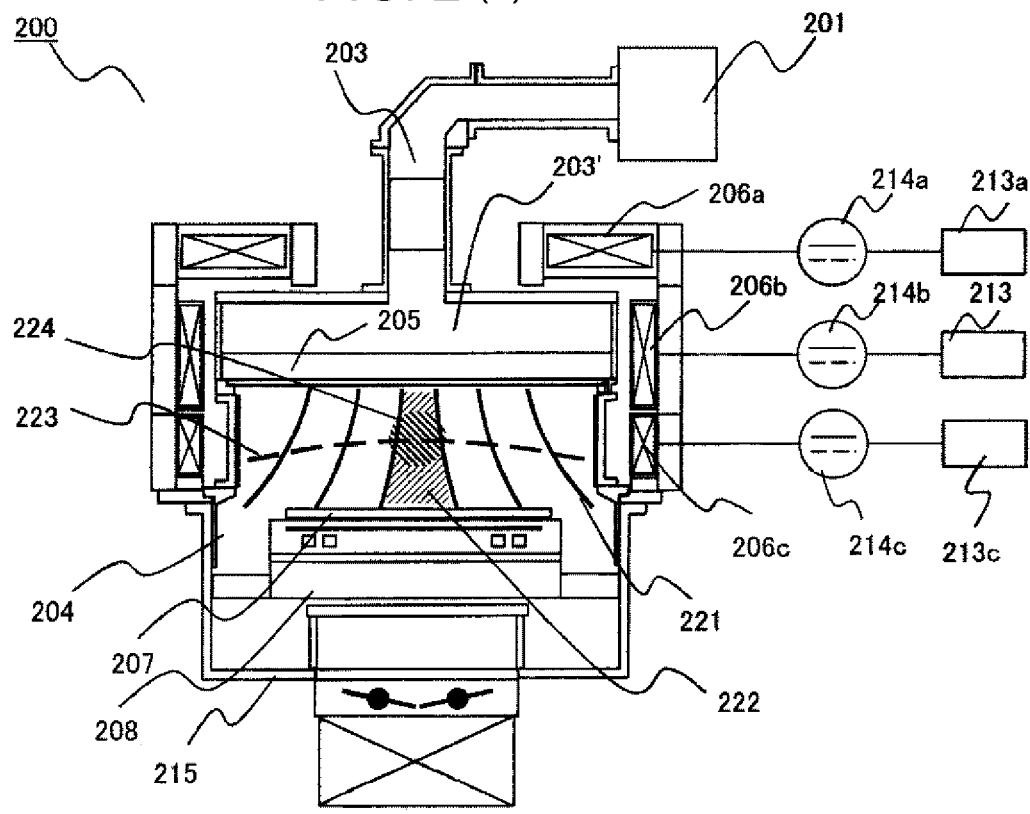
FIGS. 2(a) and 2(b) are a longitudinal sectional view schematically illustrating a configuration of a plasma processing apparatus according to a related art and a graph schematically illustrating a distribution of characteristics of processing of wafers performed inside the plasma processing apparatus.
Figure 2:
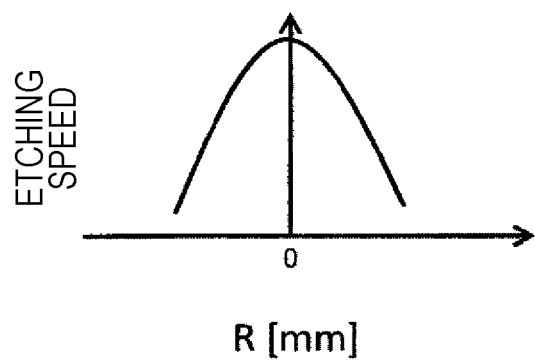
Figure 3:
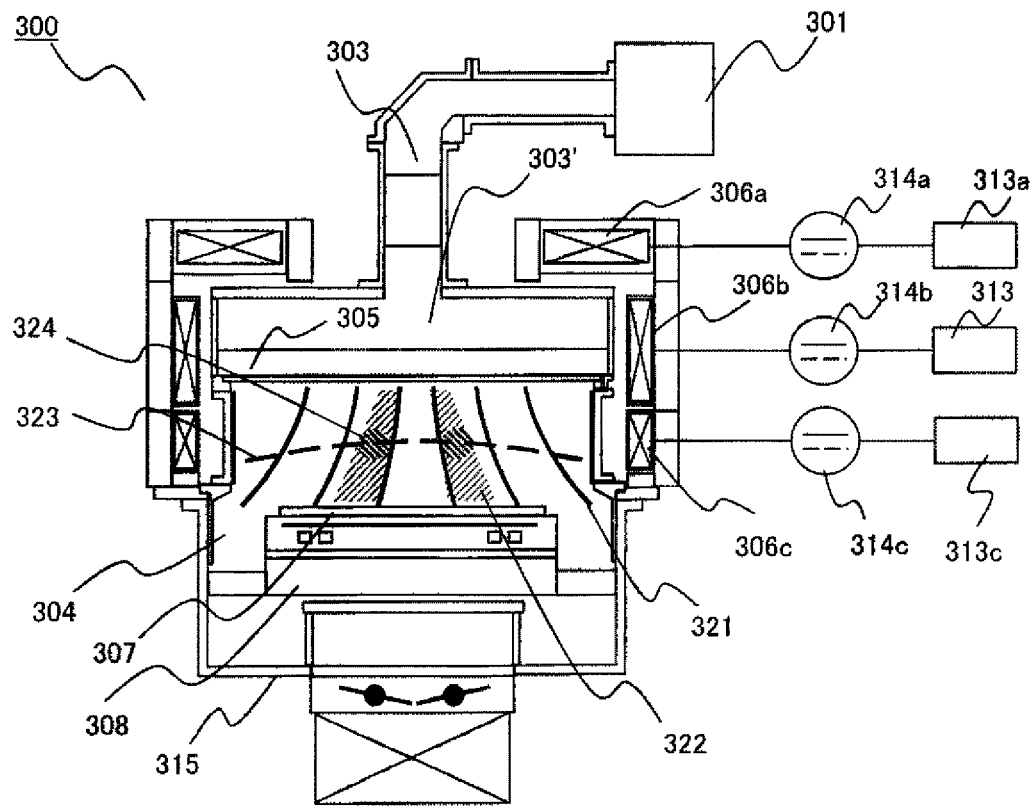
FIGS. 3(a) and 3(b) are a longitudinal sectional view schematically illustrating a configuration of the plasma processing apparatus according to the related art and a graph schematically illustrating a distribution of characteristics of processing of wafers performed inside the plasma processing apparatus.
Figure 3:
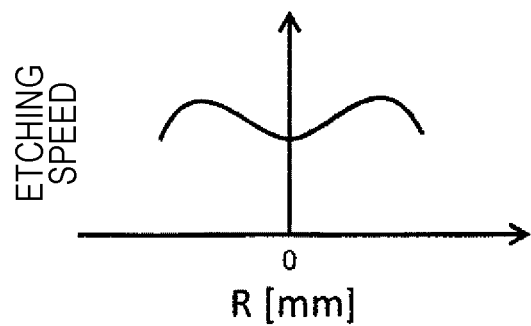
Figure 4:
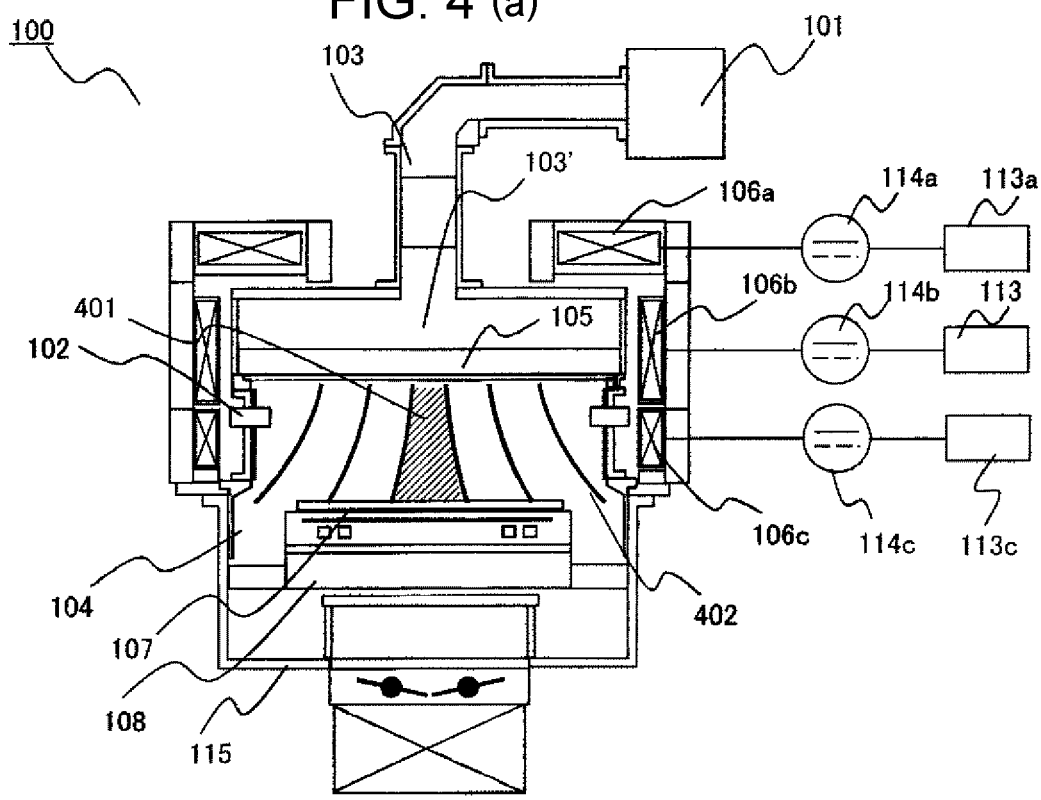
FIGS. 4(a) and 4(b) are a longitudinal sectional view schematically illustrating a plasma area formed inside a processing chamber at a specific time in which DC power is supplied from a coil power supply unit to a solenoid coil in the plasma processing apparatus according to the embodiment of the invention.
Figure 4:
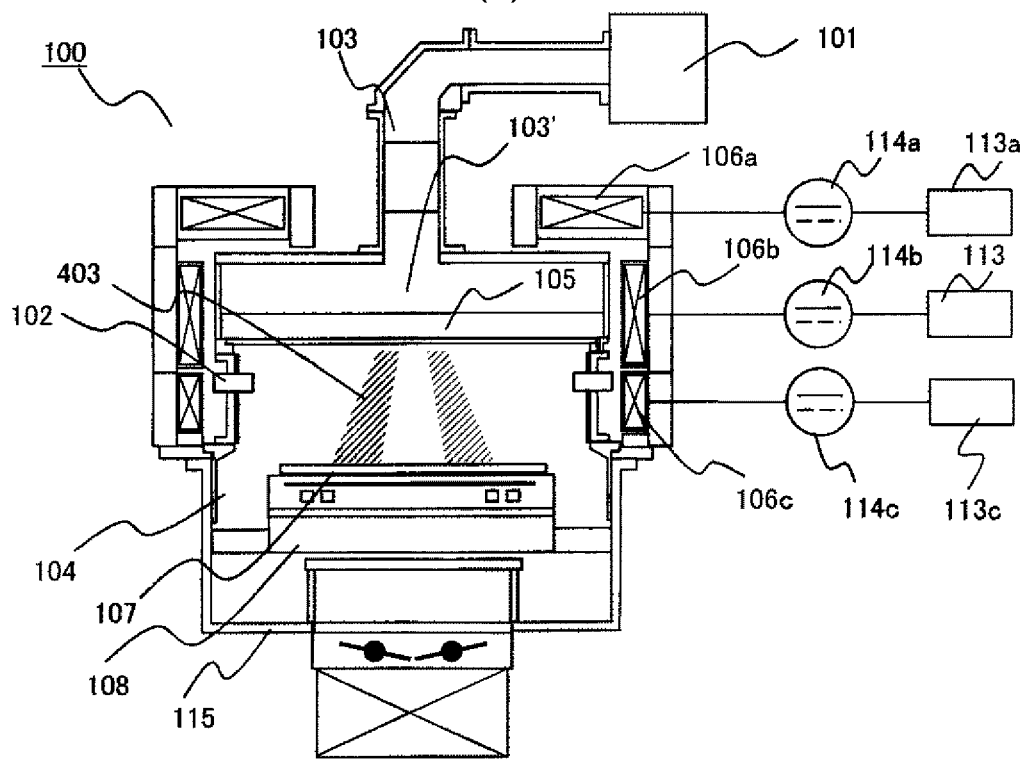
Figure 5:
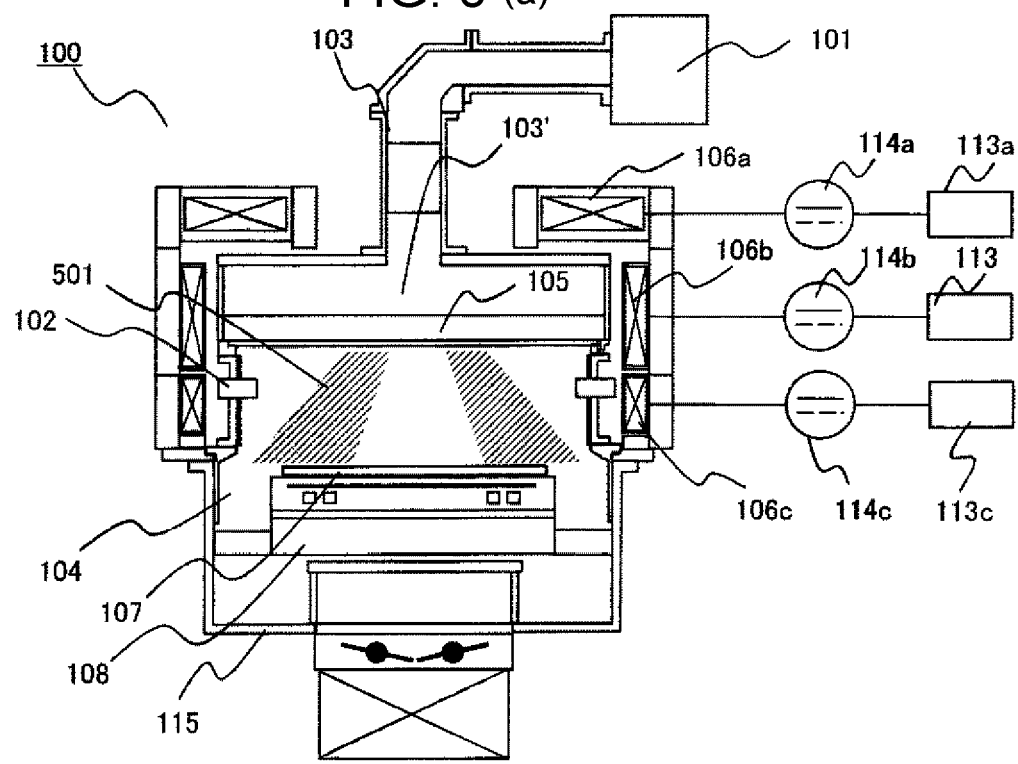
FIGS. 5(a) and 5(b) are a longitudinal sectional view schematically illustrating the plasma area formed inside the processing chamber at the specific time in which the DC power is supplied from the coil power supply unit to the solenoid coil in the plasma processing apparatus according to the embodiment of the invention.
Figure 5:
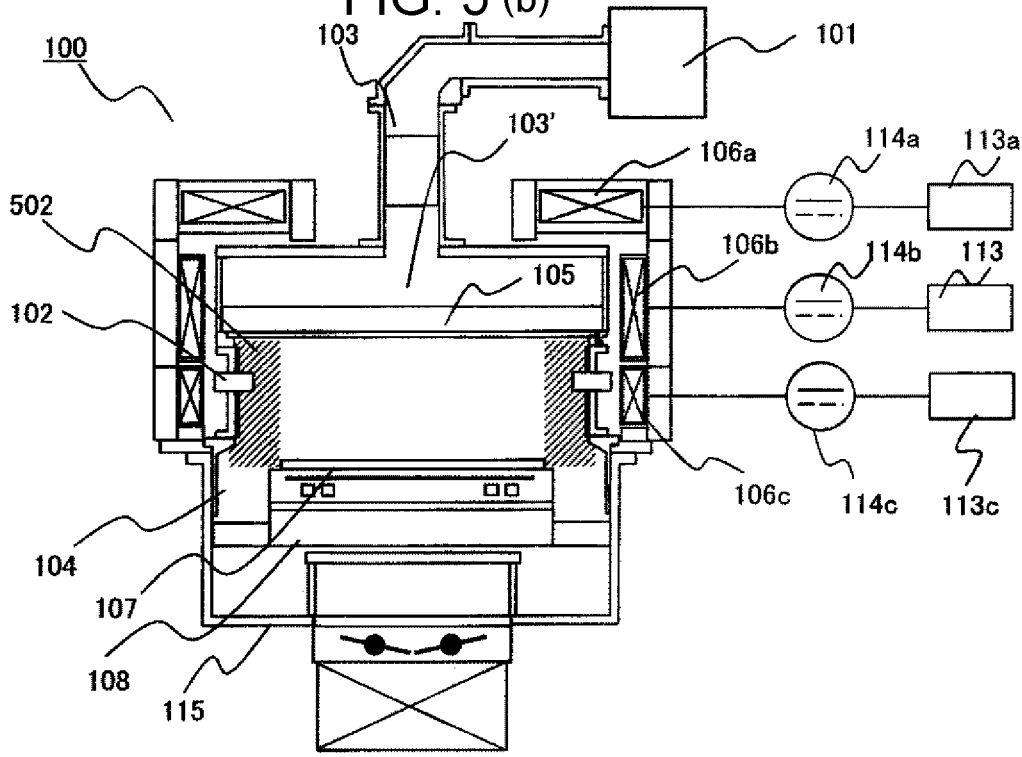
Figure 6:
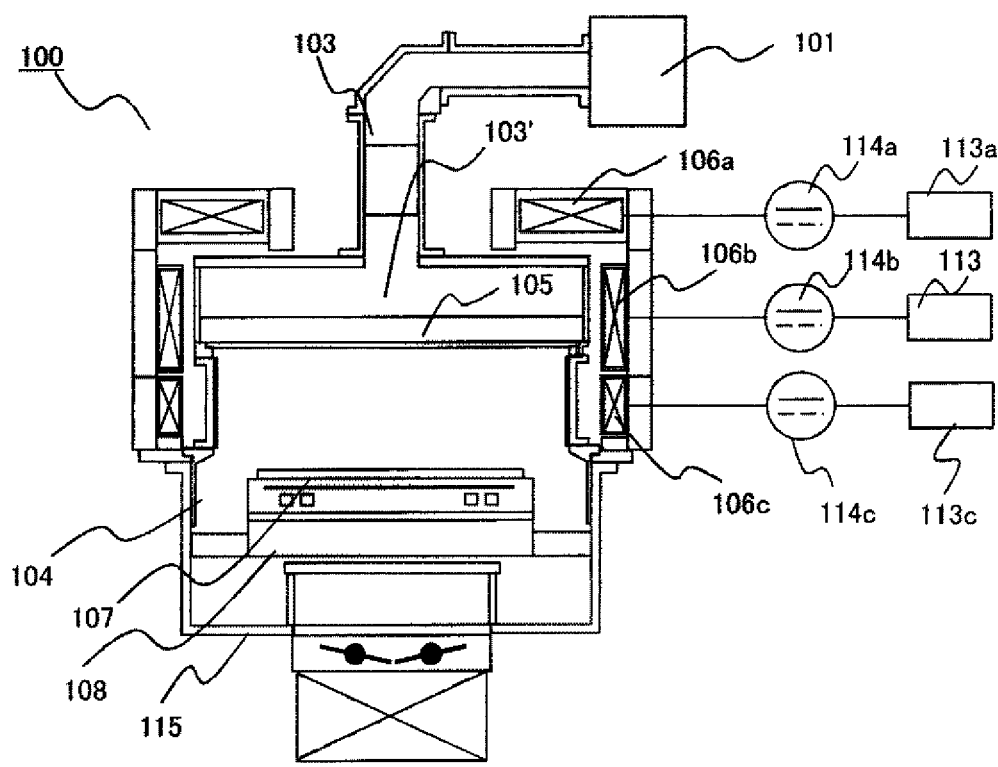
FIGS. 6(a) and 6(b) are a longitudinal sectional view schematically illustrating the plasma area formed inside the processing chamber at the specific time in which the DC power is supplied from the coil power supply unit to the solenoid coil in the plasma processing apparatus according to the embodiment of the invention and a graph schematically illustrating a distribution of characteristics of processing of wafers performed inside the plasma processing apparatus.
Figure 6:
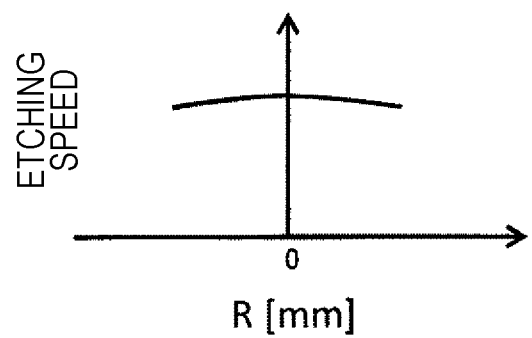
Figure 9:
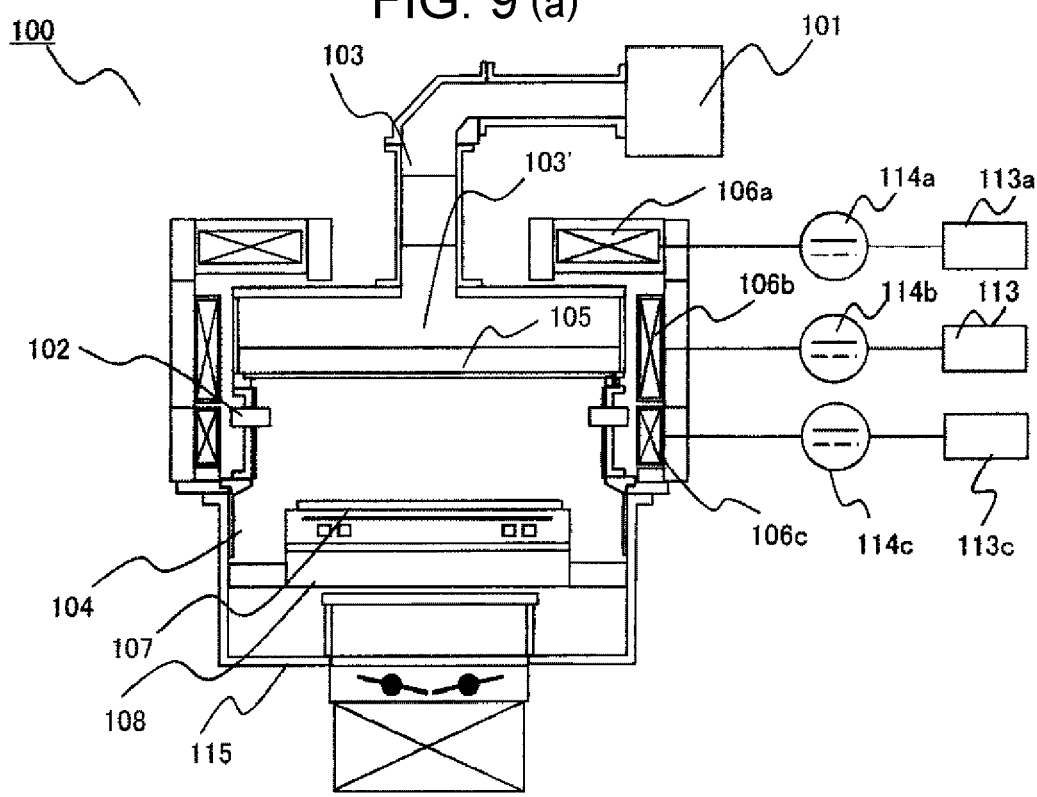
FIGS. 9(a) and 9(b) are a longitudinal sectional view schematically illustrating the plasma area formed inside the processing chamber at the specific time in which the DC power is supplied from the coil power supply unit to the solenoid coil in the plasma processing apparatus according to the modified example of the embodiment illustrated in FIG. 1 and a graph schematically illustrating a distribution of characteristics of processing of wafers performed inside the plasma processing apparatus.
Figure 9:
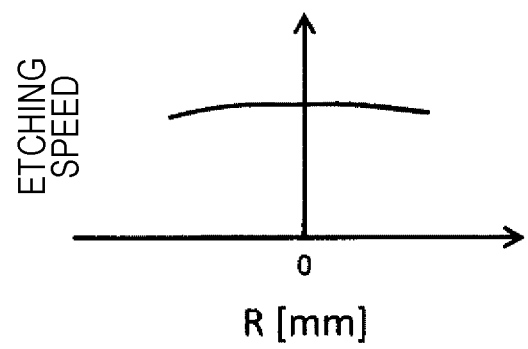

A distribution of the density or intensity as the time average of the plasma formed inside the processing chamber 104 of the plasma processing apparatus 100 operated as described above with time is formed so that a bias in a direction from the center to the inner wall surface of the processing chamber 104 is suppressed. For this reason, the etching speed as the time average on the top surface of the wafer 107 during the etching by the plasma has a uniform distribution as illustrated in FIG. 9(*b*) or substantially becomes uniform as illustrated in FIGS. 2(*b*) and 3(*b*) while a bias thereof is reduced.

As described above, as in the embodiment, when the current supplied to the solenoid coils 106a to 106c based on the plasma state detected by the plasma monitor 102 is supplied while being time-modulated, an area having a high intensity or density of the plasma formed inside the processing chamber 104 is moved or distributed inside the processing chamber 104 or the top surface of the wafer 107 in time in the radial direction of the wafer 107. Accordingly, it is possible to obtain a more uniform processing result of the top surface of the wafer 107 by reducing a bias in speed or progress of the processing of the top surface of the wafer 107 with time.

In the embodiment and the modified example illustrated in FIGS. 1 to 11, the DC power is supplied from the coil power supply units 114a to 114c to the solenoid coils 106a to 106c while being adjusted to a different value during two continuously repeated periods while the wafer 107 is processed. During the processing of the wafer 107, the current value is increased from the minimum value to the maximum value at the time t0' to t1 corresponding to the first period at an arbitrary number-th time, the maximum value is maintained at the time t0 to t1, and the current value is decreased from the maximum value to the minimum value at the time t1 to t5 corresponding to the second period at the arbitrary number-th time subsequent to the first period at the arbitrary number-th time. Particularly, at the time t2 to t5, the minimum value is maintained.

In the above-described example, the first period of the arbitrary number+1-th time in which the DC power value supplied from the coil power supply units 114a to 114c to the solenoid coils 106a to 106c in response to an instruction signal from the control device is started at the time t5 after the detection of the state where the light emission intensity of the plasma detected by the plasma monitor 102 becomes smaller than a predetermined allowable range. That is, the time t5 in which the second period of the arbitrary number-th time ends becomes the time t0' in which the first period of the next time starts. When the first period of the next time ends at the time t1 (after a second (t1−t0') from the time t5 of the arbitrary number-th time), the second period of the next time is started and the first and second periods are repeated during the processing of the wafer 107.

Meanwhile, in the second period, at least the time during which a diffusion occurs is given, for example, the time t1 to t3 in the above-described embodiment is set as one cycle. Then, the first period of generating the next (new) plasma is started without waiting for a time until a position having a maximum density of the plasma extends at the time t1 and moves toward the outer periphery of the processing chamber 104 so that the particles disappear due to the collision with the inner wall surface at the outer periphery of the processing chamber 104. By repeating these periods, the generation and the diffusion of the plasma may be repeated. Also in this case, the microwave formed by the oscillation of the microwave generation power supply unit 101 is transferred inside the waveguide 103, passes through the window member 105, and is supplied into the processing chamber 104 during the first and second periods which are continuously repeated.

In the processing chamber 104 that processes the wafer 107 while the first and second periods are repeated, the magnetic fields generated by the solenoid coils 106a to 106c at the first period of the arbitrary number-th time of generating the plasma in the processing chamber is supplied into the processing chamber, and the movement of charged particles forming the plasma being diffused in the second period (at the arbitrary number-1-th time) before the first period at the arbitrary number-th time due to the magnetic field is restrained in the direction of the magnetic force line so that the diffusion is suppressed. For this reason, a position having a maximum density of the plasma diffused in the second period at the arbitrary number-1-th time is located at a specific position in the radial direction of the processing chamber 104 or the wafer 107 and the second period of the next time (the arbitrary number-th time) is started after the first period of the arbitrary number-th time ends. Then, the current supplied to the solenoid coils 106a to 106c is decreased or the supply thereof is stopped, the intensity of the magnetic field supplied into the processing chamber 104 decreases or becomes a minimum value, the restraint by the magnetic field is reduced or removed, and charged particles in the plasma diffused in the second period at the arbitrary number-1-th time are diffused along with particles in the plasma formed in the first period at the arbitrary number-th time.

At this time, the density of the particles of the plasma diffused in the second period at the arbitrary number-1-th time decreases during the first period at the arbitrary number-th time in which the movement direction is restrained by the magnetic field. However, the high density is maintained at the same position in the radial direction of the processing chamber 104 or the wafer 107 compared to the case of the embodiment in which the second period is continued until the magnetic field supplied from the solenoid coils 106a to 106c to the processing chamber 104 is decreased or the supply of the magnetic field is stopped, the particles in the plasma are diffused toward the inner wall surface of the processing chamber 104, and the plasma disappears. As described above, in this example in which the microwave is supplied into the processing chamber 104 even in the second period, when the intensity of the microwave is equal to or larger than a value capable of forming the plasma only by the electric field, the density of the plasma in the second period can be controlled at a value equal to or larger than the density of the plasma formed only by the microwave.

Further, in this example, the plasma formed in the first period at the arbitrary number-th time starts to be diffused along with the plasma formed and diffused beforehand at the second period subsequent to the first period. For this reason, the plasma having a higher density can be formed or diffused at a plurality of positions in the radial direction of the wafer 107 inside the processing chamber 104 and hence the uniformity or speed of the processing in the radial direction of the wafer 107 can be improved.

REFERENCE SIGNS LIST 100 plasma processing apparatus
101 microwave generation power supply unit
102 plasma monitor
103 waveguide
104 processing chamber
105 window member
106a, 106b, 106c solenoid coil
107 wafer
108 sample stage
109 DC power supply unit
110 high-frequency power supply unit
111 high-frequency filter
112 matching circuit
113a, 113b, 113c controller
114a, 114b, 114c coil power supply unit
115 vacuum container
203 waveguide
204 processing chamber
205 window member
206a, 206b, 206c solenoid coil
208 sample stage
214a, 214b, 214c coil power supply unit
215 processing container
221 magnetic force line
222 plasma
223 ECR surface
224 plasma of ECR surface
401 plasma
402 magnetic force line
403 plasma
501, 502 plasma
701, 702 plasma
801, 802 plasma

The invention claimed is:

1. A plasma processing apparatus comprising:
    a processing chamber which is disposed inside a vacuum container;
    a sample stage which is disposed inside the processing chamber and has a top surface for placing a wafer to be processed thereon;
    an electric field generating part which generates an electric field supplied into the processing chamber;
    a coil which generates a magnetic field for generating plasma inside the processing chamber by an interaction with the electric field; and
    a controller which increases or decreases an intensity of the plasma inside the processing chamber by repeatedly causing the intensity of the magnetic field generated by the coil to be at a first value and a second value lower than the first value in respective predetermined intervals,
    wherein the wafer is processed while the plasma is repeatedly generated and diffused.

2. The plasma processing apparatus according to claim 1, wherein the controller increases or decreases the magnetic field of the coil by using a result of an amount representing the intensity of the plasma or a change in intensity thereof while the wafer is processed.

3. The plasma processing apparatus according to claim 1, wherein the controller decreases the intensity of the magnetic field of the coil after the plasma is generated and a change in intensity of the plasma falls within a predetermined range.

4. The plasma processing apparatus according to claim 3, wherein the controller increases or decreases the magnetic field of the coil by using a result of an amount representing the intensity of the plasma or a change in intensity thereof while the wafer is processed.

5. The plasma processing apparatus according to claim 1, wherein the controller increases the magnetic field of the coil after an amount representing the intensity of the plasma becomes smaller than a predetermined lower limit value.

6. The plasma processing apparatus according to claim 5, wherein the controller decreases the magnetic field to remove the plasma and increases the magnetic field to generate the plasma again.

7. A plasma processing method comprising:
    placing a wafer to be processed on a top surface of a sample stage inside a processing chamber of a vacuum container,
    supplying an electric field and a magnetic field interacting with the electric field into the processing chamber to generate plasma inside the processing chamber; and
    processing the wafer,
    wherein an intensity of the magnetic field generated by the coil is repeatedly made to be at a first value and a second value lower than the first value in respective predetermined periods and the plasma is repeatedly generated and diffused to process the wafer.

8. The plasma processing method according to claim 7, wherein the magnetic field of the coil is increased or decreased by using a result of an amount representing the intensity of the plasma or a change in intensity thereof while the wafer is processed.

9. The plasma processing method according to claim 7, wherein the intensity of the magnetic field of the coil is decreased after the plasma is generated and a change in intensity of the plasma falls within a predetermined range.

10. The plasma processing method according to claim 9, wherein the magnetic field of the coil is increased or decreased by using a result of an amount representing the intensity of the plasma or a change in intensity thereof while the wafer is processed.

11. The plasma processing method according to claim 7, wherein the magnetic field of the coil is increased after an amount representing the intensity of the plasma becomes smaller than a predetermined lower limit value.

12. The plasma processing method according to claim 11, wherein the magnetic field is decreased to remove the plasma and is increased to generate the plasma again.

* * * * *